US012757422B2

(12) United States Patent
More et al.

(10) Patent No.: US 12,757,422 B2
(45) Date of Patent: Oct. 6, 2026

(54) METHOD FOR MANUFACTURING SEMICONDUCTOR STRUCTURE WITH SOURCE/DRAIN STRUCTURE HAVING MODIFIED SHAPE

(71) Applicant: TAIWAN SEMICONDUCTOR MANUFACTURING COMPANY, LTD., Hsinchu (TW)

(72) Inventors: Shahaji B. More, Hsinchu City (TW); Shih-Chieh Chang, Taipei City (TW); Cheng-Han Lee, New Taipei City (TW); Huai-Tei Yang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 359 days.

(21) Appl. No.: 18/616,832

(22) Filed: Mar. 26, 2024

(65) Prior Publication Data

US 2024/0234548 A1 Jul. 11, 2024

Related U.S. Application Data

(62) Division of application No. 17/089,138, filed on Nov. 4, 2020, now Pat. No. 11,973,127, which is a division (Continued)

(51) Int. Cl.

| | |
|---|---|
| ***H10D 30/62*** | (2025.01) |
| ***H10D 30/01*** | (2025.01) |
| ***H10D 62/00*** | (2026.01) |
| ***H10D 62/13*** | (2025.01) |
| ***H10D 62/80*** | (2025.01) |

(Continued)

(52) U.S. Cl.

CPC ..... *H10D 30/0241* (2025.01); *H10D 30/6211* (2025.01); *H10D 30/6212* (2025.01);

(Continued)

(58) Field of Classification Search

CPC ........... H10D 30/0241; H10D 30/6211; H10D 30/6212; H10D 30/6219; H10D 62/021;

(Continued)

(56) References Cited

U.S. PATENT DOCUMENTS 8,836,016 B2 9/2014 Wu et al.
8,841,701 B2 * 9/2014 Lin ...................... H10D 30/024 257/65

(Continued)

FOREIGN PATENT DOCUMENTS

TW 201436212 A 9/2014
WO WO 2017/111845 A1 6/2017

*Primary Examiner* — David Vu
(74) *Attorney, Agent, or Firm* — Birch, Stewart, Kolasch & Birch, LLP

(57) ABSTRACT

Semiconductor structures and method for forming the same are provide. The method includes forming a fin structure extending in a first direction over a substrate and forming spacers on sidewalls of the fin structure to laterally sandwiched the fin structure in a second direction. The method further includes etching the fin structure in a third direction to form a recess between the spacers and forming a doped region in the fin structure exposed by the recess. The method further includes removing an upper portion of the doped region and annealing a bottom portion of the doped region after removing the upper portion of the doped region. The method further includes forming a source/drain structure over the bottom portion of the doped region.

20 Claims, 24 Drawing Sheets

Related U.S. Application Data of application No. 15/962,348, filed on Apr. 25, 2018, now Pat. No. 10,840,358.

(60) Provisional application No. 62/586,313, filed on Nov. 15, 2017.

(51) Int. Cl.

*H10D 62/834* (2025.01)
*H10P 30/20* (2026.01)
*H10P 50/24* (2026.01)

(52) U.S. Cl.

CPC ....... *H10D 30/6219* (2025.01); *H10D 62/021* (2025.01); *H10D 62/151* (2025.01); *H10D 62/80* (2025.01); *H10D 62/834* (2025.01); *H10P 30/204* (2026.01); *H10P 30/21* (2026.01); *H10P 50/242* (2026.01)

(58) Field of Classification Search

CPC .... H10D 62/151; H10D 62/80; H10D 62/834; H10P 30/204; H10P 30/21; H10P 50/242; H10P 30/28

See application file for complete search history.

(56) References Cited

U.S. PATENT DOCUMENTS

| | | | |
|---|---|---|---|
| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,576,814 | B2 | 2/2017 | Wu et al. |
| 2011/0316046 | A1 | 12/2011 | Chan et al. |
| 2012/0034748 | A1 | 2/2012 | Shin |
| 2013/0001591 | A1 | 1/2013 | Wu et al. |
| 2014/0353732 | A1 | 12/2014 | Adam et al. |
| 2015/0270342 | A1 | 9/2015 | Tsai et al. |
| 2015/0294881 | A1 | 10/2015 | Tsai et al. |
| 2015/0348791 | A1 | 12/2015 | Higuchi et al. |
| 2016/0013316 | A1 | 1/2016 | Kuang et al. |
| 2016/0027918 | A1 | 1/2016 | Kim et al. |
| 2016/0181403 | A1 | 6/2016 | Xu |
| 2017/0077305 | A1 | 3/2017 | Chang et al. |
| 2017/0213889 | A1 | 7/2017 | Gluschenkov et al. |

* cited by examiner

METHOD FOR MANUFACTURING SEMICONDUCTOR STRUCTURE WITH SOURCE/DRAIN STRUCTURE HAVING MODIFIED SHAPE

PRIORITY CLAIM AND CROSS-REFERENCE

This application is a Divisional Application of U.S. patent application Ser. No. 17/089,138, filed on Nov. 4, 2020, which is a Divisional Application of U.S. patent application Ser. No. 15/962,348, filed on Apr. 25, 2018, which claims the benefit of U.S. Provisional Application No. 62/586,313, filed on Nov. 15, 2017, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
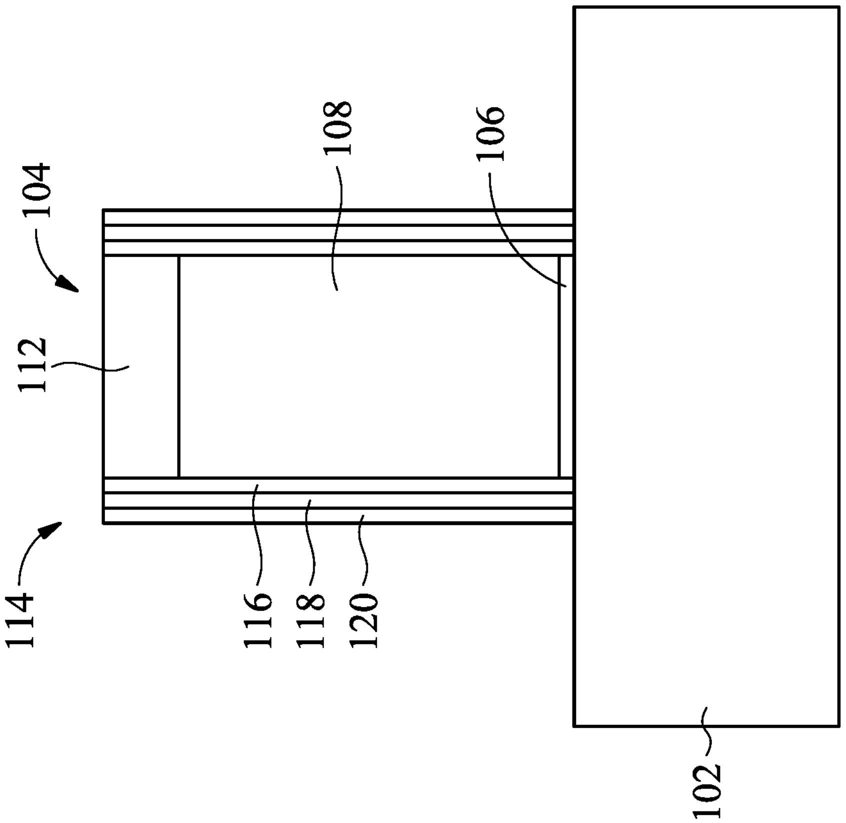
FIGS. 1A to 1E illustrate cross-sectional representations of various stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of semiconductor structures and methods for forming the same are provided. The semiconductor structure may include a gate structure formed over a substrate and a recess formed in the substrate adjacent to the gate structure. After the recess is formed, a source/drain structure may be formed in the recess. In addition, the recess may be formed by performing two etching processes, so that the profile of the resulting recess may be easier to control as designed, and therefore the performance of the source/drain structure formed in the recess may be improved.

FIGS. 1A to 1E illustrate cross-sectional representations of various stages of manufacturing a semiconductor structure 100 in accordance with some embodiments. As show in FIG. 1A, a gate structure 104 is formed over a substrate 102 in accordance with some embodiments.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the substrate 102 includes structures such as doped regions, isolation features, interlayer dielectric (ILD) layers, and/or conductive features. In addition, the substrate 102 may further include single or multiple material layers to be patterned. For example, the material layers may include a silicon layer, a dielectric layer, and/or a doped polysilicon layer.

The gate structure 104 may be a dummy gate structure which will be replaced by a metal gate structure afterwards. In some embodiments, the gate structure 104 includes a gate dielectric layer 106, a gate electrode layer 108 formed over the gate dielectric layer 106 and a hard mask layer 112 formed over the gate electrode layer 108.

In some embodiments, the gate dielectric layer 106 is made of silicon oxide. In some embodiments, the gate dielectric layer 106 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, the gate electrode layer 108 is made of polysilicon. In some embodiments, the hard mask layer 112 is made of silicon nitride. The hard mask layer 112 may be formed by using low-pressure chemical vapor deposition (LPCVD) or plasma enhanced chemical vapor deposition (PECVD), although other deposition processes may also be used in some other embodiments.

After the gate structure 104 is formed, spacers 114 are formed on sidewalls of the gate structure 104, as shown in FIG. 1A in accordance with some embodiments. In some embodiments, the spacer 114 includes a first dielectric layer 116, a second dielectric layer 118, and a third dielectric layer 120. In some embodiments, the first dielectric layer 116 and the third dielectric layer 120 are oxide layers and the second dielectric layer 118 is a nitride layer.

Figure 1B:
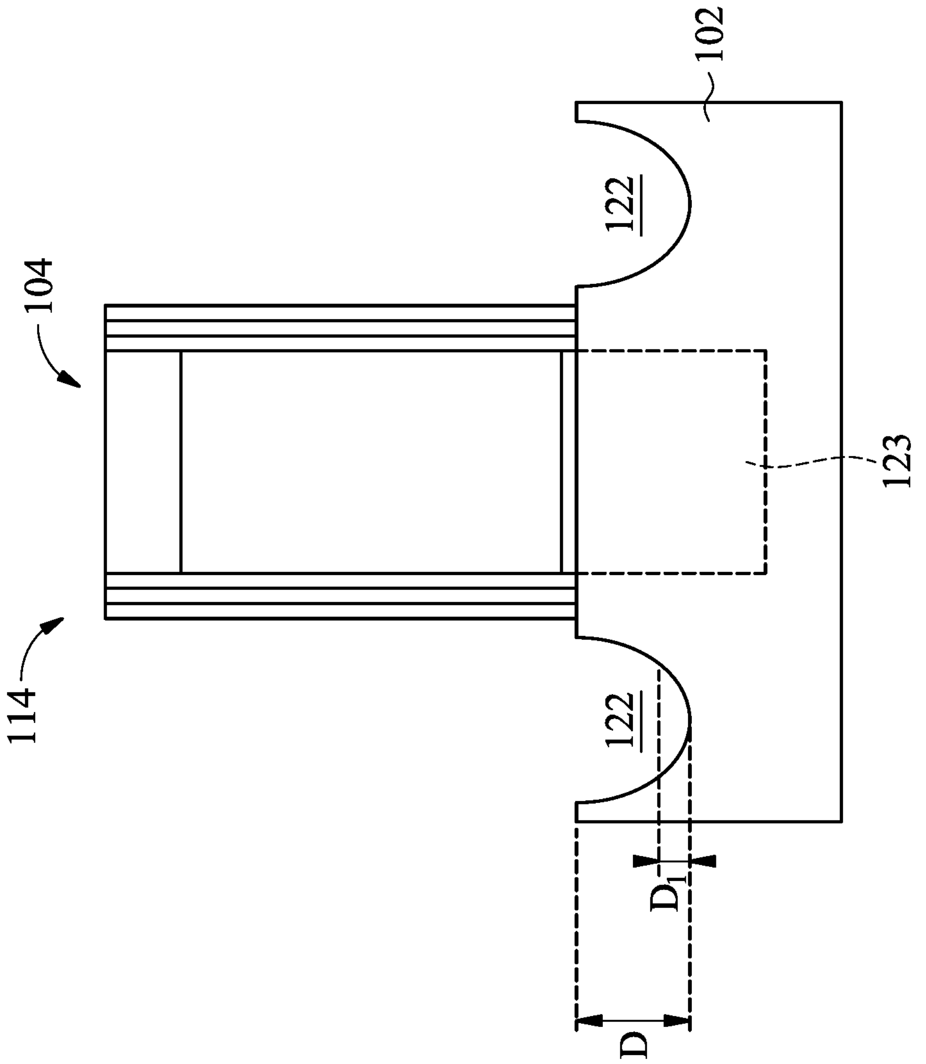

Next, recesses 122 are formed in the substrate 102 adjacent to the gate structure 104, as shown in FIG. 1B in accordance with some embodiments. In some embodiments, the recesses 122 are formed by etching the substrate 102 using a fluorine-based etchant in a dry etching process. In some embodiments, the fluorine-based etchant used as the etchant includes $BF_2$, $CH_2F_2$, or the like. In some embodiments, fluorine residues are formed on the sidewalls and the top surface of the recesses 122. In some embodiments, the etchant further includes $Cl_2$. In some embodiments, the formation of the recesses 122 further includes using He, Ar, or a combination thereof.

As shown in FIG. 1B, the recesses 122 formed by etching the substrate 102 may have a narrower bottom width and a wider top width. That is, the lateral distance between a channel region 123 and the top portion of the recess 122 is smaller than the lateral distance between the channel region 123 and the bottom portion of the recess 122.

The channel region 123 described above may be defined as the region in the substrate 102 directly below the gate structure 104. The lateral distance between the channel region 123 and the top portion of the recess 122 may be defined as the lateral distance between the channel region 123 and an edge of the recess 122 at the top surface of the substrate 102. In addition, the lateral distance between the channel region 123 and the bottom portion of the recess 122 may be defined as the average lateral distance between the channel region 123 and the bottom ¼ portion of the recess 122. The bottom ¼ portion of the recess may be defined as the lowest ¼ portion of the recess having the depth $D_1$, as shown in FIG. 1B, and the depth $D_1$ is about ¼ of the total depth D of the whole recess 122.

In some embodiments, the difference between the lateral distance between the channel region 123 and the top portion of the recess 122 and the lateral distance between the channel region 123 and the bottom portion of the recess 122 is greater than about 3 nn.

Figure 1C:
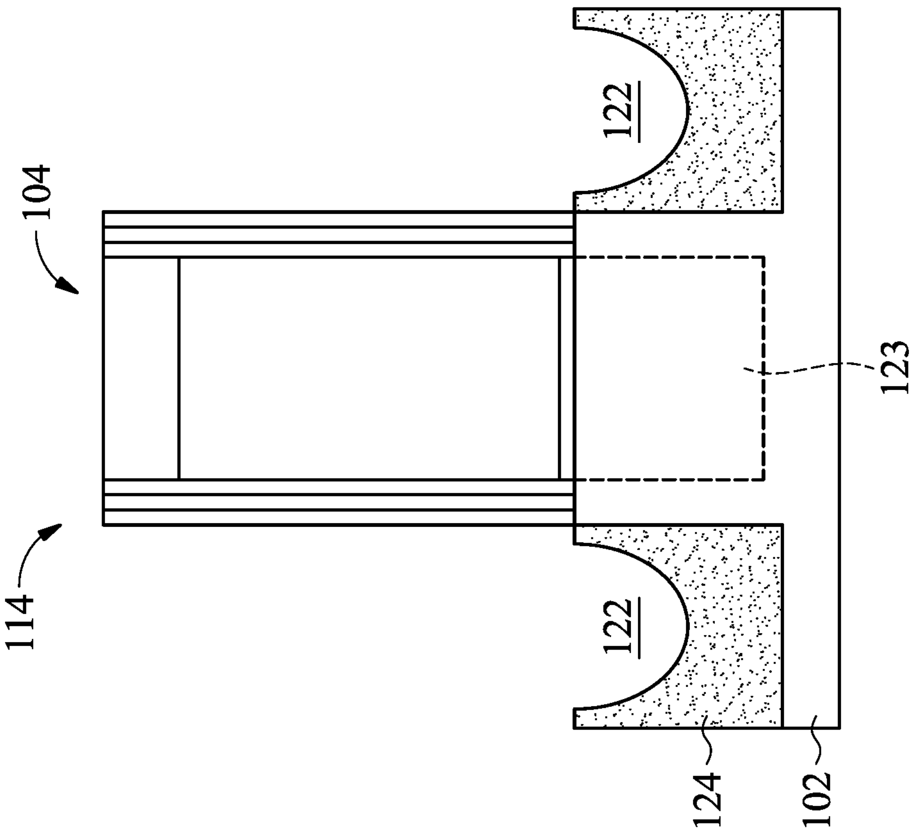

After the recesses 122 are formed, doped regions 124 are formed around the recesses 122, as shown in FIG. 1C in accordance with some embodiments. In some embodiments, dopants are doped from the recesses 122 to form the doped regions 124 at the sidewalls and the bottom surfaces of the recesses 122 by performing an implant process. In some embodiments, the dopants include As, P, Sb, B, or the like. In some embodiments, the doped regions 124 are As-doped regions.

In some embodiments, the dopant dose of the doped region 124 is in a range from about 1×10 atoms/$cm^{-2}$ to about 1×10 atoms/$cm^{-2}$. The dopant dose of the dopant in the doped region 124 may be controlled to be large enough so that etching of the doped region in subsequent process would be more sufficient. However, the dopant dose of the dopant in the doped region 124 may not be too large or the dopants may diffuse into other portions of the structure, such as the channel region 123.

The doped regions 124 may be formed by doping the dopants, such as As, from the top side of the substrate 102 into the portions under the recesses 122. In some embodiments, the bottom width of the doped region 124 is greater than the bottom width of the recess 122. In some embodiments, the distances between the doped region 124 and the channel region 123 at its topmost portion and its bottommost portion are substantially the equal.

Figure 1D:
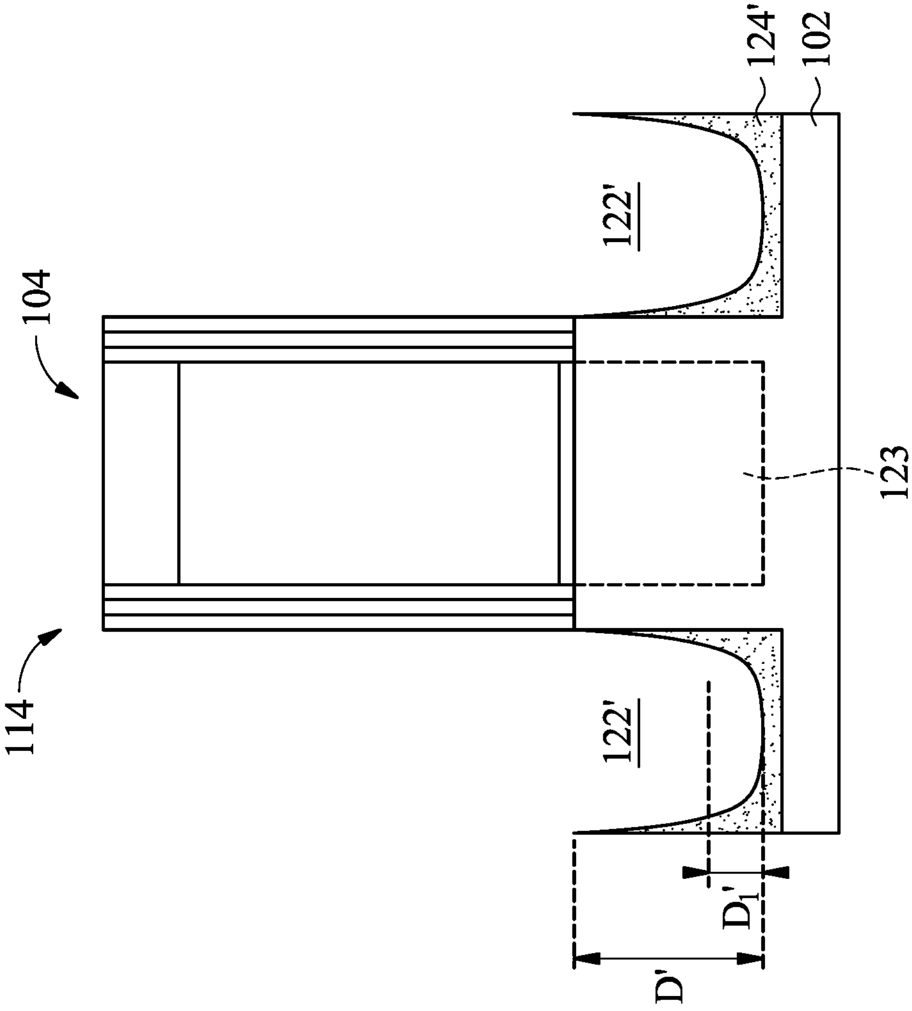

Next, each doped region 124 is at least partially removed to form modified recesses 122', as shown in FIG. 1D in accordance with some embodiments. In some embodiments, the modified recesses 122' are formed by etching the doped regions 124 using a chlorine-based etchant in a dry etching process. By forming the doped regions 124 first and partially removing the doped regions 124 to form the modified recesses 122', the shape of the resulting recesses 122' may be easier to control as designed, compared to the formation of the recess 122 shown in FIG. 1B. The resulting modified recess 122' may be formed to have a relatively greater bottom width, so that performance of source/drain structures formed in the modified recesses 122' afterwards may be improved (Details will be described later.)

By partially removing the doped regions 124, the modified recess 122' shown in FIG. 1D is larger than the recess 122 shown in FIG. 1B in accordance with some embodiments. In some embodiments, the bottom width of the modified recess 122' is greater than the bottom width of the recess 122. That is, the shape of the recess 122 is modified to form the modified recess 122' which has a wider width at its bottom portion. Accordingly, the lateral distance between the channel region 123 and the bottom portion of the modified recess 122' shown in FIG. 1D is smaller than the lateral distance between the channel region 123 and the bottom portion of the recess 122 shown in FIG. 1B in accordance with some embodiments. The lateral distance between the channel region 123 and the bottom portion of the modified recess 122' may be defined as the average lateral distance between the channel region 123 and the bottom ¼ portion of the modified recess 122', and the bottom portion of the modified recess 122' may have a depth $D_1'$ which is about ¼ of the depth D' of the whole recess 122'.

In some embodiments, the lateral distance between the channel region 123 and the top portion of the modified recess 122' is smaller than the lateral distance between the channel region 123 and the bottom portion of the modified recess 122'. In some embodiments, the difference between the lateral distance between the channel region 123 and the top portion of the modified recess 122' and the lateral distance between the channel region 123 and the bottom portion of the modified recess 122' is in a range from about 1 nm to about 2 nm. The lateral distance between the channel region 123 and the top portion of the modified recess 122' may be defined as the lateral distance between the channel region 123 and the edge of the modified recess 122' at the top surface of the substrate 102.

In some embodiments, the doped regions 124 are As doped regions, and the As doped regions may be etched by performing a dry etching process. In some embodiments, the As doped regions 124 are etched using a chlorine-based etchant, and Cl in the etchant may react with the substrate 102 to form Si—Cl bonding. The Si—Cl bonding may be broken rapidly due to the charge imbalance resulting from the As in the doped regions 124. Therefore, the etching reactivity of the substrate 102 may be increased. In addition, the conformity of the resulting modified recess 122' may also be improved because of the presence of As in the doped regions 124, and therefore the shape of the resulting modified recess 122' may be easier to control. Furthermore, even if some chlorine residues are left on the modified recesses 122', the performance of the source/drain structures formed in the modified recesses 122' in subsequent processes will not be undermined due to the chlorine residues.

Furthermore, as described previously, when the substrate 102 is etched to form the recesses 122, the resulting recesses 122 tend to have narrower bottom widths, compared to their top widths. In some embodiments, the As doped regions 124 are formed after the recesses 122 are formed, and the As doped regions 124 are etched to form the modified recesses 122 with a designed shape since the etching of As doped regions 124 may have a greater etching rate, compared to the original non-doped substrate 102, and be easier to control.

As described previously, some fluorine residues may remain on the top surfaces of the recesses 122 due to the formation of the recesses 122. In some embodiments, these fluorine residues are removed as the doped regions 124 are partially removed. Accordingly, contamination due to the fluorine residues may be reduced.

As shown in FIG. 1D, after the modified recesses 122' are formed, some remaining portions of the doped regions 124' remain at the sidewalls and under the bottom surface of the modified recesses 122'. In some embodiments, the thickness of the remaining portion of the doped region 124' gradually increases from the top portion of the modified recess 122' to the bottom portion of the modified recess 122'. The remaining portion of the doped region 124' may be used as a shielding layer to prevent the atoms in the source/drain structure formed in the modified recess 122' in subsequent processes from diffusing into the channel region 123 (Details will be described later.)

In some embodiments, an annealing process is performed to the remaining portions of the doped regions 124'. More specifically, the remaining portions of the doped regions 124' are annealed to transfer the amorphous structure to crystalline structure in accordance with some embodiments. In some embodiments, the annealing process is an in-situ annealing process which is performed in the same chamber that is used to form source/drain structures thereover in subsequent manufacturing processes. In some embodiments, the annealing process is performed at a temperature in a range from about 600° C. to about 900° C. for about 100 sec to about 1000 sec. The annealing process may stabilize the dopant distribution in the remaining portion of the doped regions 124'. In addition, the temperature should be high enough so that the resistance of the remaining portions of the doped regions 124' can be reduced and therefore it can be used as a part of the source/drain structures formed afterwards.

Figure 1E:
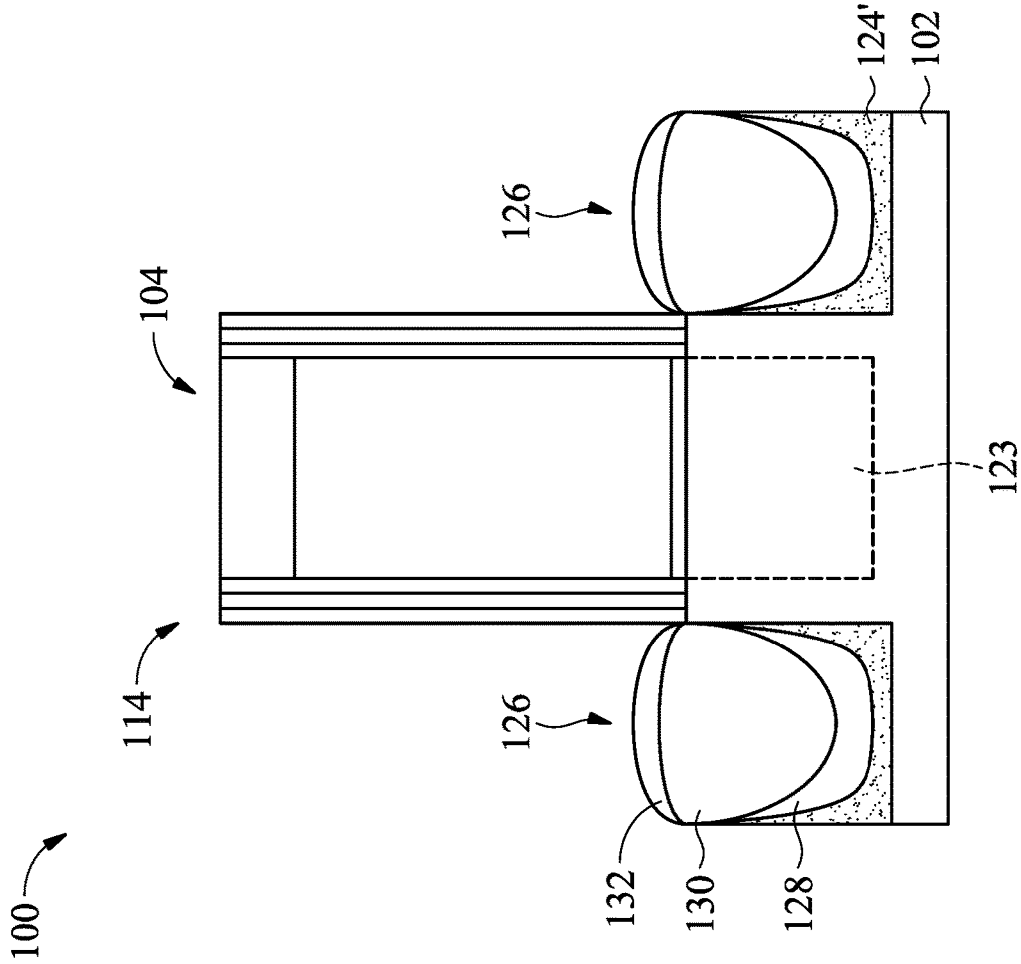

Afterwards, source/drain structures 126 are formed in the modified recesses 122', as shown in FIG. 1E in accordance with some embodiments. In some embodiments, the annealing process to crystallize the remaining portions of the doped regions 124' (e.g. shown in FIG. 1D) and the formation of the source/drain structures 126 (e.g. shown in FIG. 1E) are performed in the same chamber. As described previously, the modified recesses 122' have a relatively larger bottom width, and therefore the source/drain structures 126 formed in the modified recess 122' also have greater bottom widths. Accordingly, the distances between the channel region 123 and the source/drain structure 126 at the top portion and the bottom portion are substantially equal or have a relatively small difference, compared to the recesses 122, such that current efficiency of the resulting semiconductor structure may be improved.

More specifically, the distance between the channel region 123 and the top portion of the source/drain structure 126 is substantially equal to the distance between the channel region 123 and the top portion of the modified recess 122' described above, and the distance between the channel region 123 and the bottom of the source/drain structure 126 is substantially equal to the distance between the channel region 123 and the bottom portion of the modified recess 122' described above.

In some embodiments, the source/drain structures 126 are raised source/drain structures with a height in a range from about 3 nm to about 10 nm. The height of the raised source/drain structure may be defined by a height measure from a topmost of the raised source/drain structure to a top surface of the substrate 102.

In some embodiments, the source/drain structure 126 includes a first region 128, a second region 130 over the first region 128, and a third region 132 over the second region 130. In addition, the remaining portion of the doped regions 124' may also been seen as a portion of the source/drain structure 126.

In some embodiments, the first region 128, the second region 130, and the third region 132 respectively includes dopants such as P (phosphorous), B (boron), As (arsenic), Sb (antimony) or the like. In some embodiments, the first region 128, the second region 130, and the third region 132 are all P-doped regions. In some embodiments, the first region 128, the second region 130, and the third region 132 are sequentially formed by epitaxially growing in an epitaxial-growth chamber.

In some embodiments, the first region 128 is made of P doped Si, As doped SiP, or P doped SiAs. In some embodiments, a SiP layer is epitaxially grown on the remaining portion of the doped region 124' to form the first region 128. After the SiP layer is formed, some As in the remaining portion of the doped region 124' will diffuse into the outer region of the first region 128, such that the outer region of the first region 128 includes As, while the inner region of the first region 128 does not include As in accordance with some embodiments. The outer region of the first region 128 is defined as the side that is in direct contact with the remaining portion of the doped region 124'. On the other hand, the inner region of the first region 128 is defined as the side that is in direct contact with the second region 130.

In some embodiments, the concentration of P (phosphorous) in the first region 128 is in a range from about $1\times10^{19}$ to about $1\times10^{21}$ atoms/cm$^3$. In some embodiments, the second region 130 is formed by epitaxially growing a SiP layer over the first region 128. In some embodiments, the concentration of the P (phosphorous) in the second region 130 is greater than the concentrations of the P (phosphorous) in the first region 128. In some embodiments, the concentration of P (phosphorous) in the second region 130 is in a range from about $1\times10^{20}$ to about $5\times10^{21}$ atoms/cm$^3$. In some embodiments, a contact formed afterwards is in direct contact with the second region 130 (not shown in FIG. 1E).

In some embodiments, the third region 132 is formed by epitaxially growing a material layer over the second region 130. As shown in FIG. 1E, the top surface of the second region 130 is completely covered by the third region 132 in accordance with some embodiments. The third region 132 may be seen as a cap layer which is configured to prevent the out-diffusion of the second region 130. More specifically, the third region 132 may be formed to prevent the high-concentration dopants, such as P, in the second region 130 from diffusing into other regions of the semiconductor structure. In some embodiments, the third region 132 is made of Si, P doped SiGe, or SiP. In some embodiments, the concentration of P (phosphorous) in the third region 132 is lower than the concentrations of the P (phosphorous) in the second region 130. In some embodiments, the concentration of P (phosphorous) in the third region 132 is in a range from about $1\times10^{20}$ atoms/cm$^3$ to about $3\times10^{21}$ atoms/cm$^3$.

As described previously, the remaining portions of the doped regions 124' may be used as shielding layers to prevent the dopants in the source/drain structures 126 from diffusing into the channel region 123 under the gate structure 104. For example, the source/drain structure 126, which may be made of highly doped SiP, is surrounded by the remaining portions of the doped regions 124'. Therefore, the remaining portions of the doped regions 124' may physically block or at least slow down the P atoms from diffusing into the channel region 123. In addition, since the diffusivity of As atoms is lower than that of P atoms, the function of the channel region 123 may not be undermined due to the diffusion of the As atoms in the remaining portions of the doped regions 124'.

In some embodiments, the thickness of the remaining portion of the doped region 124' increases gradually from the top to the bottom of the source/drain structure 126. In some embodiments, the bottom portion of the source/drain structure 126 is fully covered/surrounded by the remaining portion of the doped region 124'. The remaining portion of the doped region 124' under the source/drain structure 126 may prevent dopants/contaminates in the substrate 102 under the source/drain structure 126 from diffusing into the source/drain structures 126.

As described above, the semiconductor structure 100 includes the source/drain structures 126 formed adjacent to the gate structure 104, and the source/drain structures 126 are formed in the enlarged modified recesses 122', which have a greater width at the bottom portions, so that the bottom portion of the source/drain structures 126 formed in the modified recesses 122' may be closer to the channel region under the gate structure 104, and therefore the current efficiency of the resulting semiconductor structure 100 may be improved.

Figure 2:
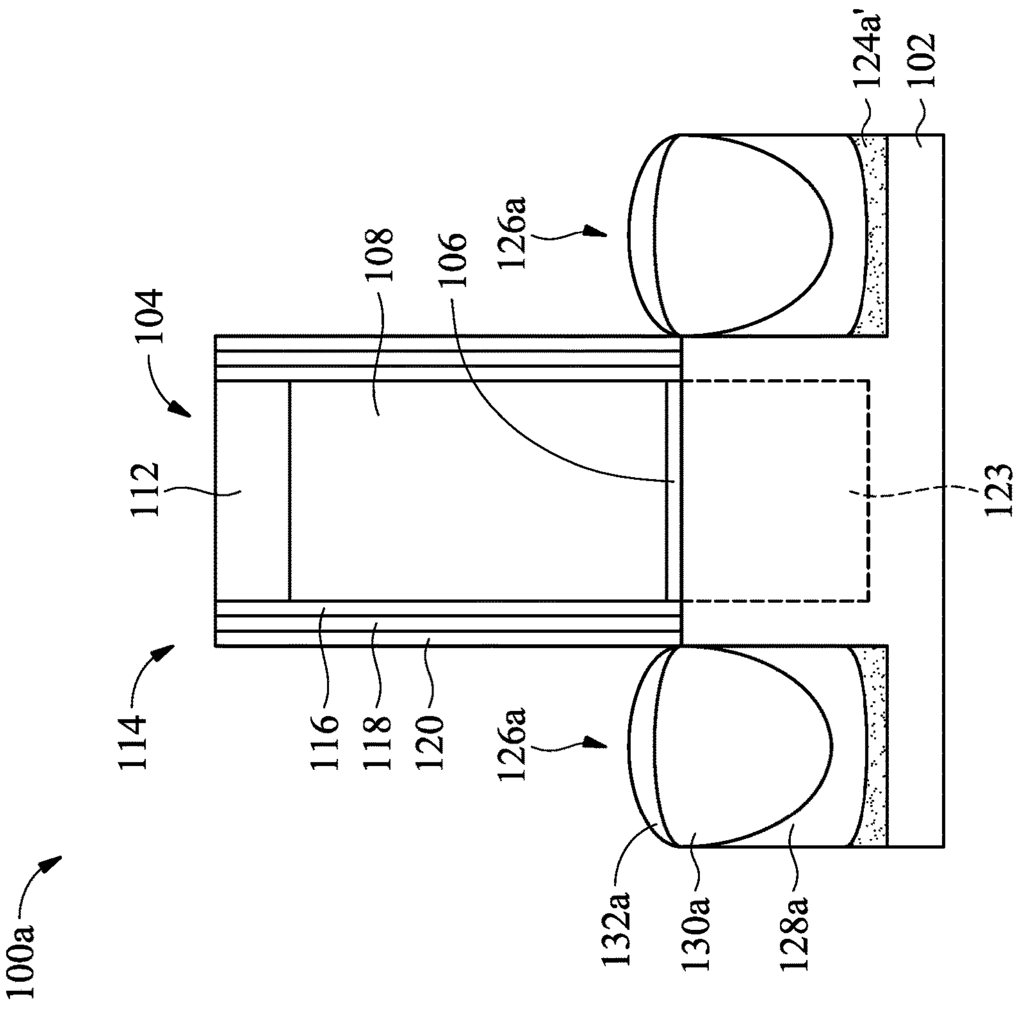
FIG. 2 illustrates a cross-sectional representation of a semiconductor structure in accordance with some embodiments.

FIG. 2 illustrates a cross-sectional representation of a semiconductor structure 100*a* in accordance with some embodiments. The semiconductor structure 100*a* may be similar to, or the same as, the semiconductor structure 100 described above, except remaining portions of doped regions remain at only the bottom of source/drain structures. Some processes and materials used to form the semiconductor structure 100*a* may be similar to, or the same as, those used to form the semiconductor structure 100 and are not repeated herein.

For example, processes similar to those shown in FIGS. 1A to 1E may be performed. More specifically, recesses (e.g. the recesses 122) may be formed in the substrate 102 adjacent to the gate structure 104 (as shown in FIG. 1B) using a fluorine-based etchant and doped regions (e.g. the doped regions 124) may be formed in the recesses (as shown in FIG. 1C). Afterwards, the doped regions may be etched using a chlorine-based etchant to form modified recesses, and source/drain structures 126*a* are formed in the modified recess. In addition, remaining portion of the doped regions 124*a*' are located under the source/drain structures 126, as shown in FIG. 2 in accordance with some embodiments.

As shown in FIG. 2, unlike the remaining portion of the doped regions 124' shown in FIG. 1E, the remaining portion of the doped region 124*a*' in the semiconductor structure 100*a* remains at the bottom portion of the source/drain structure 126*a* but not at the sidewalls of the source/drain structure 126*a*. That is, the doped region formed around the sidewalls of the original recess (e.g. the recess 122) is completely removed in accordance with some embodiments, and therefore the resulting source/drain structure 126*a* may have a greater size. In addition, the remaining portion of the doped region 124*a*' may be used as a shielding layer under the source/drain structure 126*a* to prevent dopants in the substrate 102 thereunder (e.g. dopants in well regions) from diffusing into the source/drain structure 126*a*. For example, P well regions may be formed in the substrate 102, and dopants such as B or Sb may be doped in the P well regions. The remaining portion of the doped region 124*a*' may block the diffusion of the dopants in the P well regions (e.g. B) from entering the source/drain structure 126*a* and block the diffusion of the dopants in the source/drain structure 126*a* (e.g. P) from entering the P well regions.

In some embodiments, the source/drain structure 126*a* includes a first region 128*a*, a second region 130*a*, and a third region 132*a*. In some embodiments, the bottom surface of the first region 128*a* is in direct contact with the remaining portion of the doped region 124*a*'. Processes and materials for forming the first region 128*a*, the second region 130*a*, and the third region 132*a* may be the same as those for forming the first region 128, the second region 130, and the third region 132 and are not repeated herein. For example, the first region 128*a* may also have a region including As diffusing therein from the doped region 124*a*' under the source/drain structure 126*a*.

Figure 3:
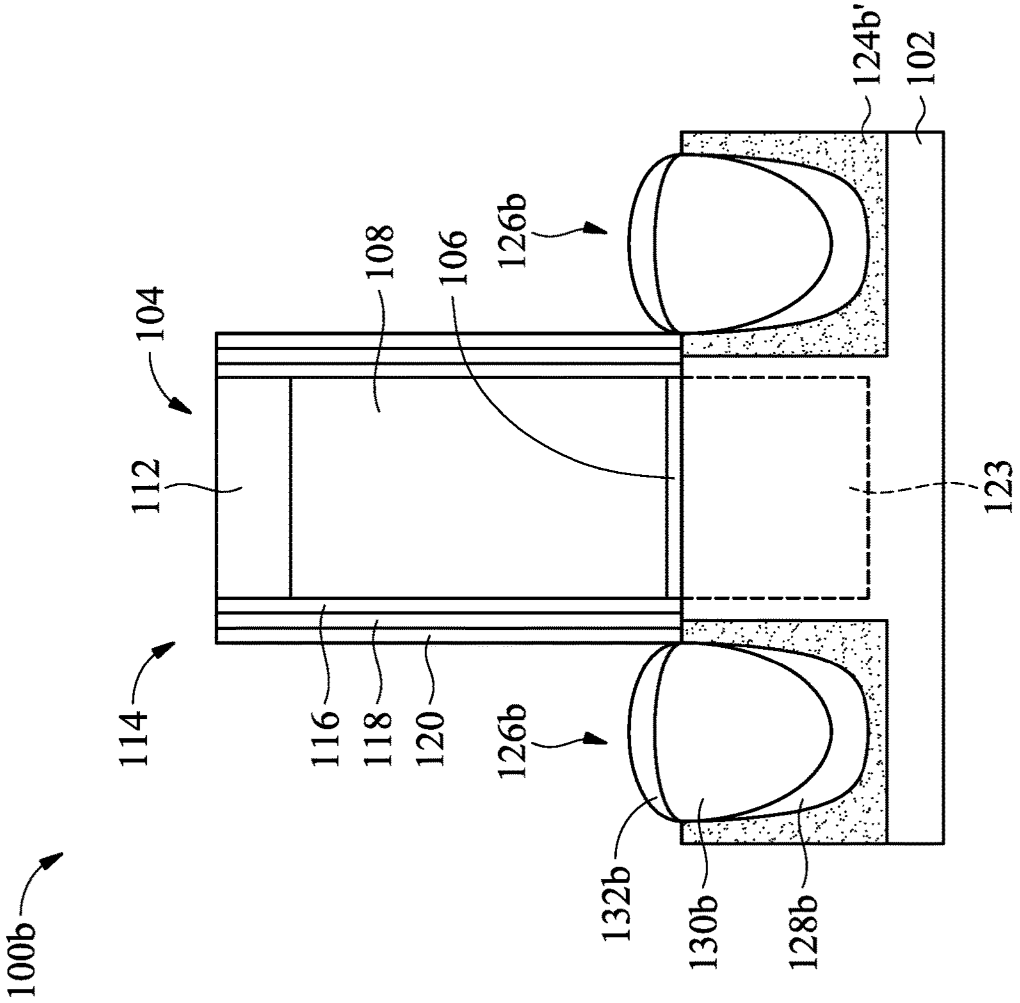
FIG. 3 illustrates a cross-sectional representation of a semiconductor structure in accordance with some embodiments.

FIG. 3 illustrates a cross-sectional representation of a semiconductor structure 100*b* in accordance with some embodiments. The semiconductor structure 100*b* may be similar to, or the same as, the semiconductor structure 100 described above, except remaining portions of doped regions further extends under the spacers 114. Some processes and materials used to form the semiconductor structure 100*b* may be similar to, or the same as, those used to form the semiconductor structure 100 and are not repeated herein.

For example, the processes shown in FIGS. 1A and 1B may be performed to form recesses (e.g. the recesses 122) in the substrate 102 adjacent to the gate structure 104 (as shown in FIG. 1B) using a fluorine-based etchant. Next, doped regions may be formed in the recesses. Unlike the doped region 124 shown in FIG. 1C, the doped region in the semiconductor structure 100*b* further extends under the spacers 114, as shown in FIG. 3 in accordance with some embodiments. After the doped regions are formed, the doped regions may be etched using a chlorine-based etchant to form modified recesses, and source/drain structures 126*b* are formed in the modified recess surrounding by the remaining portion of the doped regions 124*b*'.

As shown in FIG. 3, unlike the remaining portion of the doped regions 124' shown in FIG. 1E, the remaining portion of the doped region 124*a*' in the semiconductor structure 100*b* located at the sidewalls of the source/drain structure 126*b* further extends under the spacers 114. That is, the doped regions formed around the sidewalls of the original recess (e.g. the recess 122) are relatively thicker in accordance with some embodiments, and therefore the resulting source/drain structure 126*b* may have a greater size than the source/drain structure 126.

Similar to the source/drain structure 126, the source/drain structure 126*b* may also include a first region 128*b*, a second region 130*b*, and a third region 132*b*, and the processes and materials them may be the same as those for forming the first region 128, the second region 130, and the third region 132 and are not repeated herein.

Figure 4:
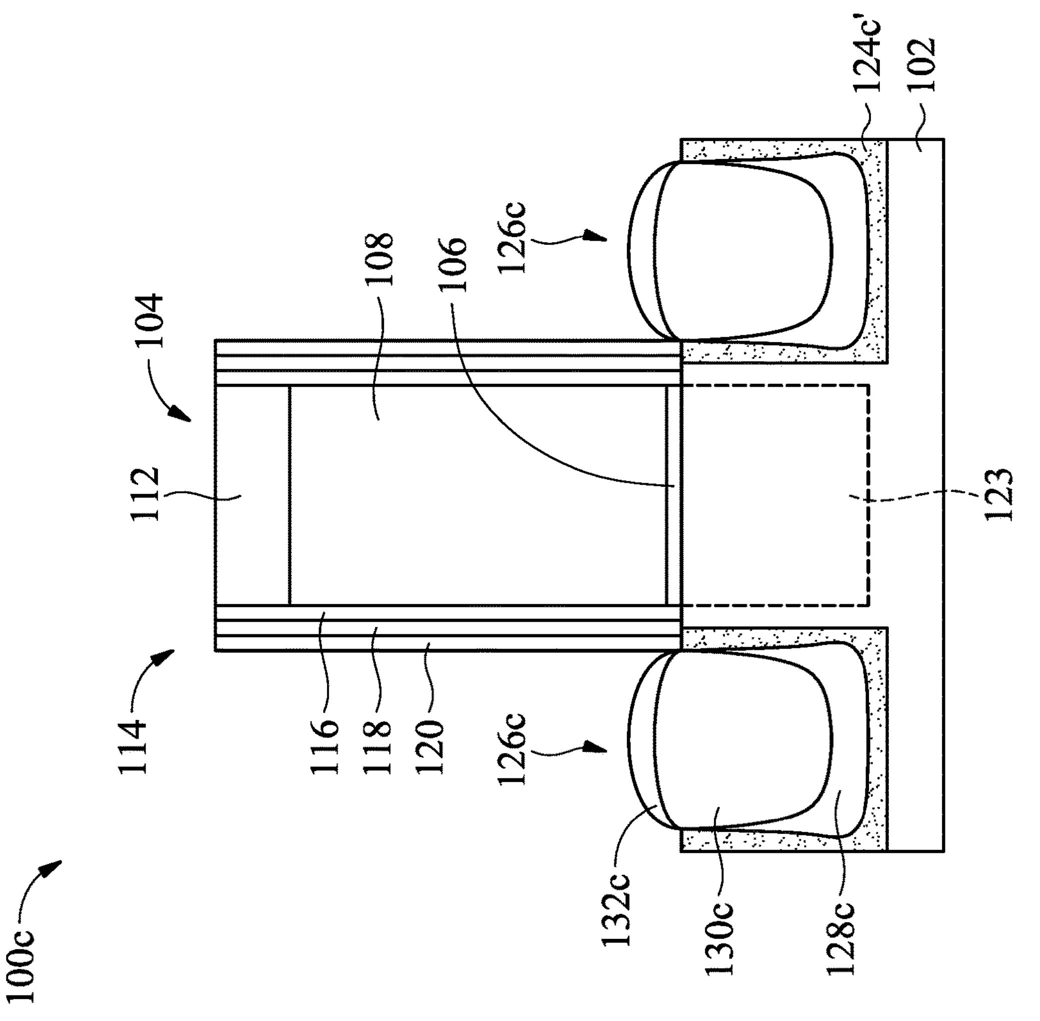
FIG. 4 illustrates a cross-sectional representation of a semiconductor structure in accordance with some embodiments.

FIG. 4 illustrates a cross-sectional representation of a semiconductor structure 100*c* in accordance with some embodiments. The semiconductor structure 100*c* may be similar to, or the same as, the semiconductor structure 100*b* described above, except the bottom portions of their source/drain structures 126*c* are wider than the top portions of the source/drain structures 126*c*. Some processes and materials used to form the semiconductor structure 100*c* may be similar to, or the same as, those used to form the semiconductor structures 100, 100*a*, and 100*b* and are not repeated herein.

More specifically, when doped regions formed in original recesses are etched to form the modified recesses, the modified recesses have wider bottom portions than their top portions. Accordingly, the bottom portions of the source/drain structures 126*c* formed in the modified recesses also have wider bottom portions than the top portions. In addition, similar to the semiconductor structure 100*b*, the remaining portion of the doped regions 124*c*' also extends below the spacers 114 formed on the sidewalls of the gate structure 104.

Similar to the source/drain structure 126, the source/drain structure 126*c* may also include a first region 128*c*, a second region 130*c*, and a third region 132*c*, and the processes and materials them may be the same as those for forming the first region 128, the second region 130, and the third region 132 and are not repeated herein.

It is noted that although not clearly shown in FIGS. 1A to 4, the semiconductor structure 100, 100*a*, 100*b*, and 100*c* may be fin field effect transistor (FinFET) structures. That is, the substrate 102 may include a fin structure and the gate structure 104 is formed over the fin structure, and the source/drain structure 126, 126*a*, 126*b* and 126*c* may be formed in the fin structure. FIGS. 5A to 5H illustrate perspective views of various stages of manufacturing a semiconductor structure 200 in accordance with some embodiments. The semiconductor structure 200 may be similar to the semiconductor structures described previously, except the fin structure in the semiconductor structure 200 is shown and labeled in the perspective views. Some processes and materials used to form the semiconductor structure 200 may be similar to, or the same as, those used to form the semiconductor structures 100, 100*a*, 100*b*, and 100*c* described previously and are not repeated herein.

Figure 5A:
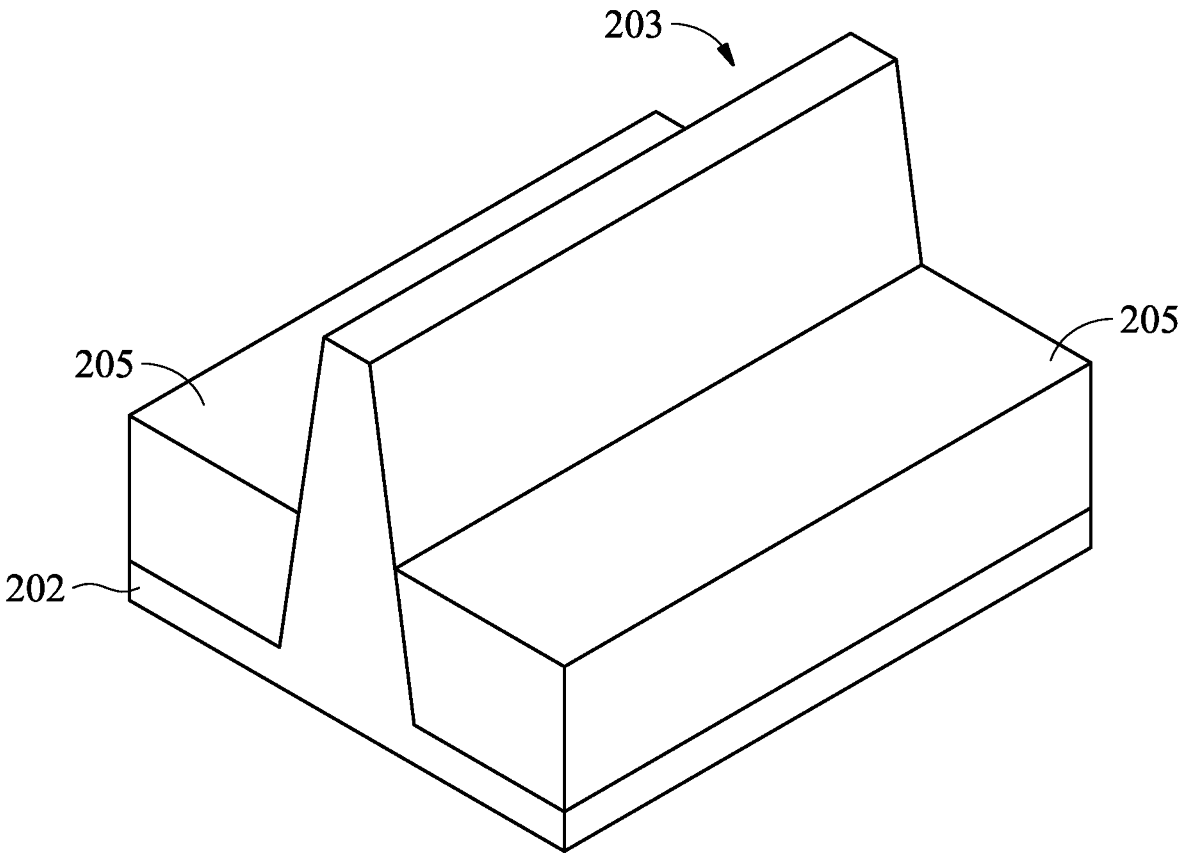
FIGS. 5A to 5H illustrate perspective views of various stages of manufacturing a semiconductor structure in accordance with some embodiments.

In some embodiments, semiconductor structure 200 is a N-type FinFET structure. As shown in FIG. 5A, a fin structure 203 is formed from a substrate 202 in accordance with some embodiments. The substrate 202 may be similar to, or the same as the substrate 102. In some embodiments, the fin structure 203 has a narrow top portion and a wide bottom portion and therefore has slope sidewalls. In some embodiments, the slope sidewall of the fin structure 203 extends along a first direction, and an angle between the first direction and the top surface (or bottom surface) of the substrate 202 is in a range from about 82° to about 88°.

After the fin structure 203 is formed, an isolation structure 205 is formed over the substrate 202, and the fin structure 203 is surrounded by the isolation structure 205, as shown in FIG. 5A in accordance with some embodiments.

The isolation structure 205 may be formed by depositing an insulating layer over the substrate 202 and recessing the insulating layer. In some embodiments, the isolation structure 205 is made of silicon oxide, silicon nitride, silicon oxynitride, fluoride-doped silicate glass (FSG), or other low-K dielectric materials.

Figure 5B:
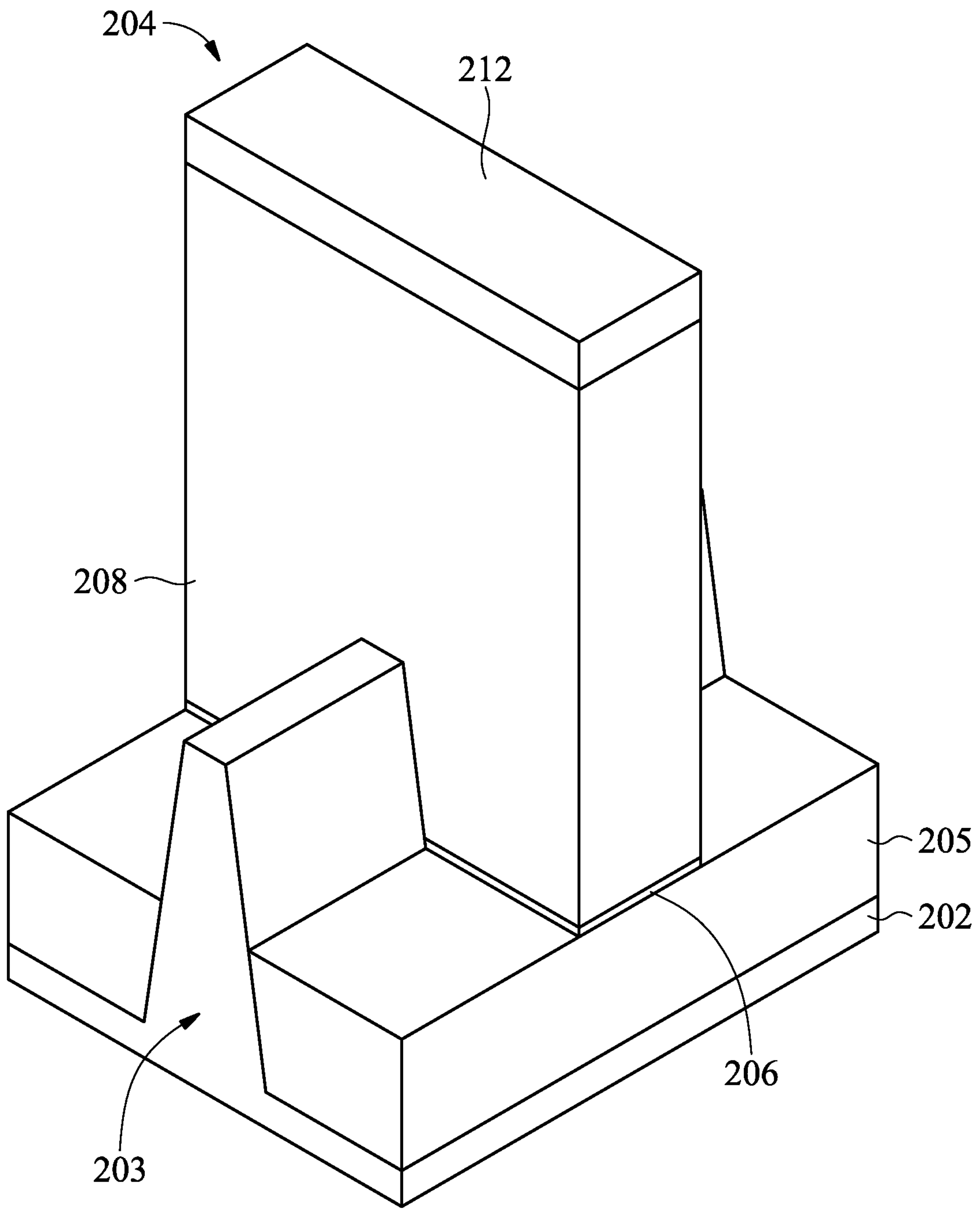

Next, a gate structure 204 is formed across the fin structure 203, as shown in FIG. 5B in accordance with some embodiments. The gate structure 204 may include a gate dielectric layer 206, a gate electrode layer 208, a dielectric layer 210, and a hard mask layer 212, and they may be similar to, or the same as, the gate dielectric layer 106, the gate electrode layer 108, and the hard mask layer 112 described previously.

Figure 5C:
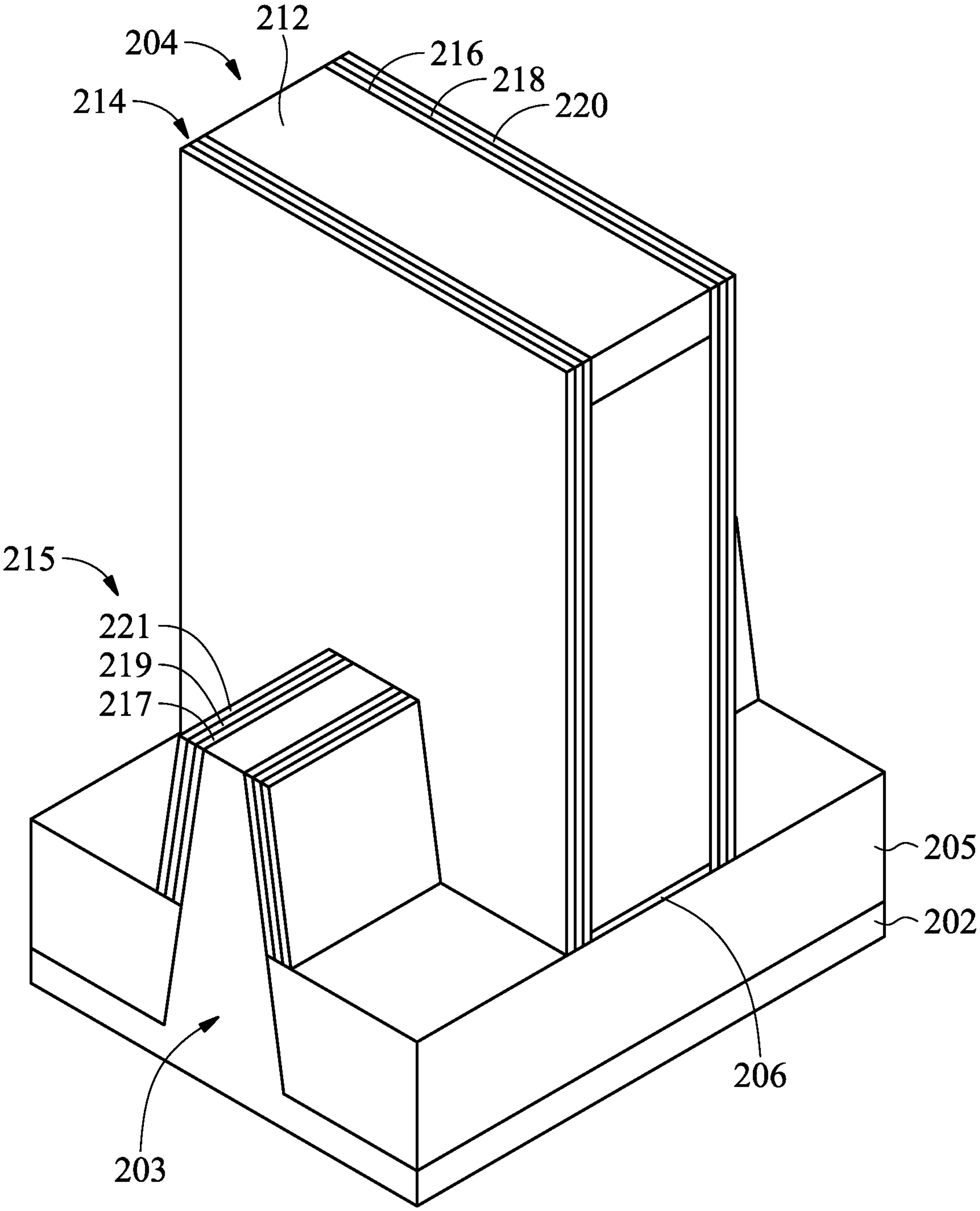

After the gate structure 204 is formed, spacers 214 are formed on the sidewalls of the gate structure 204, and spacers 215 are formed on the sidewalls of the fin structure 203, as shown in FIG. 5C in accordance with some embodiments. In some embodiments, the spacers 214 include a first dielectric layer 216, a second dielectric layer 218, and a third dielectric layer 220, and the spacers 215 include a first dielectric layer 217, a second dielectric layer 219, and a third dielectric layer 221. Materials for forming the spacers 214 and 215 may be similar to, or the same as, those for forming the spacers 114 described previously and are not repeated herein.

Figure 5D:
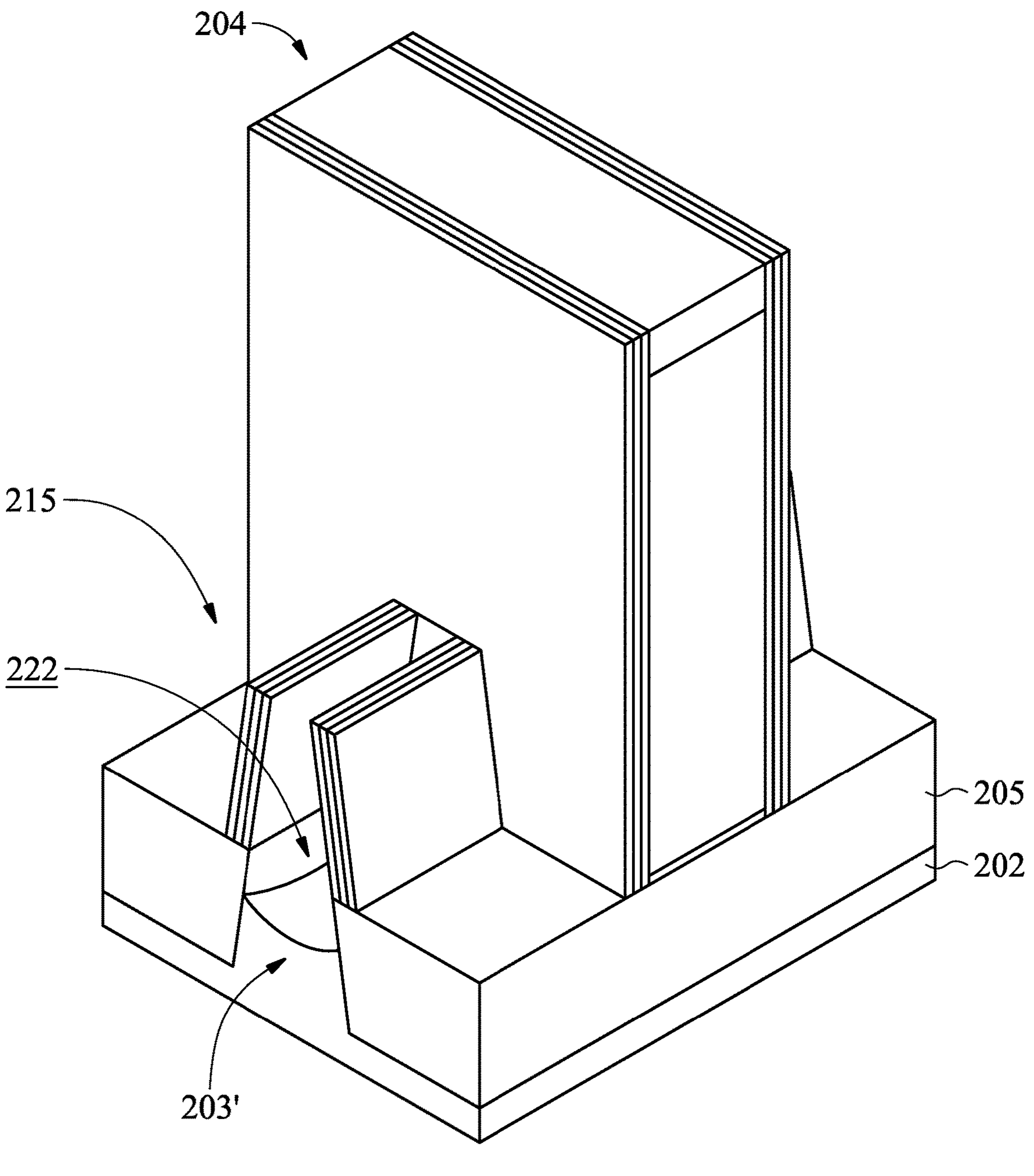

After the spacers 214 and 215 are formed, the portion of fin structure 203 not covered by the gate structure 204 is recessed to form the recessed fin structure 203', and a recess 222 is formed between the spacers 215, as shown in FIG. 5D in accordance with some embodiments. The processes used to form the recess 222 may be similar to, or the same as, those used to form the recesses 122 as shown in FIG. 1B described previously.

In some embodiments, the fin structure 203 is etched to form the recess 222 over the etched fin structure 203' by using a fluorine-based etchant. Since the fin structure 203 may have a narrower top portion and a wider bottom portion, as described previously, removal of the lower portion of the fin structure 203 may be even more difficult. Therefore, the resulting recess 222 may have a narrower bottom portion. That is, the distance between the bottommost portion of the recess 222 and the channel region (similar to the channel region 123) under the gate structure 204 may be relatively large.

Figure 5E:
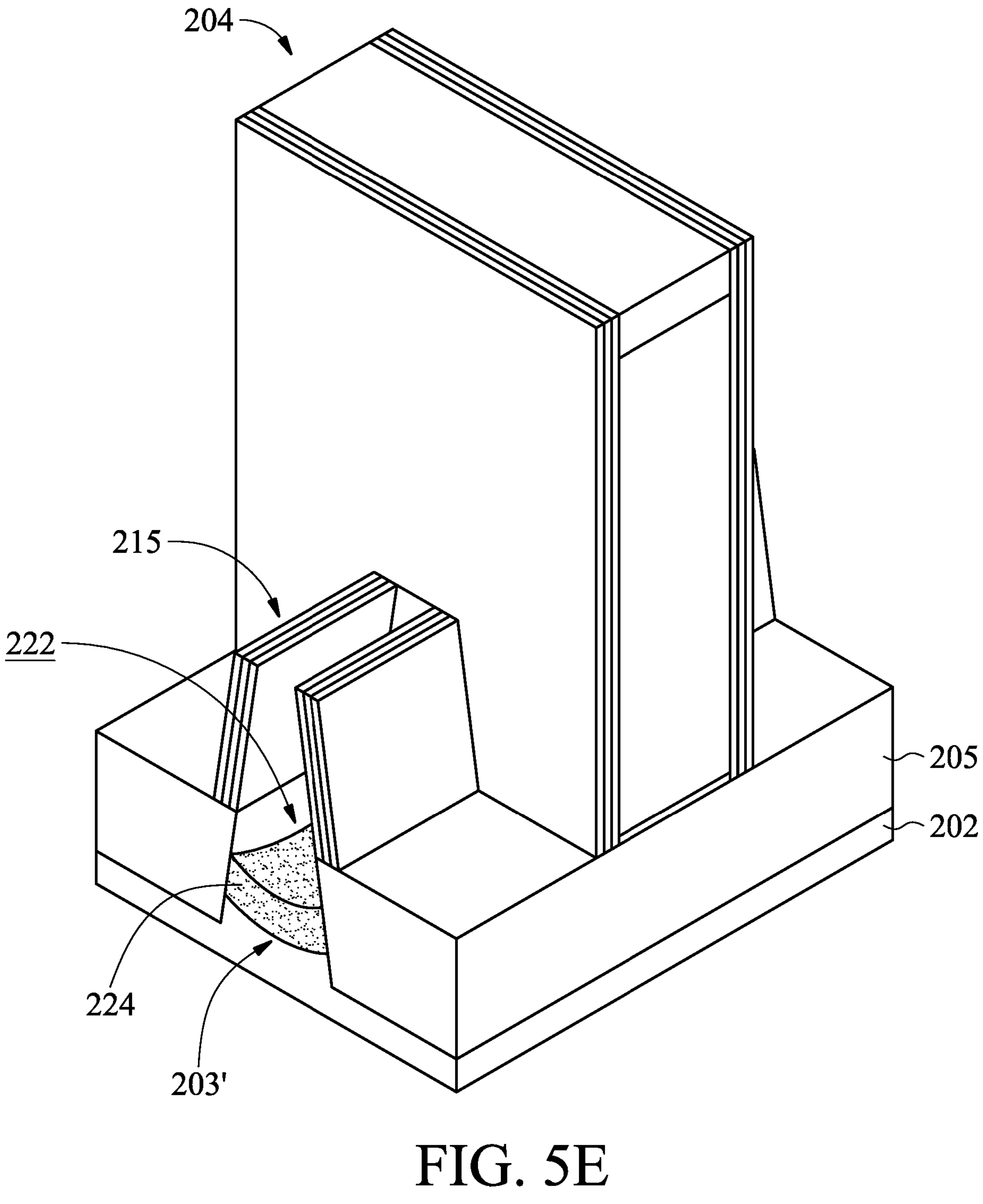

Accordingly, dopants, such as As, are implanted from the recess 222 to form a doped region 224, as shown in FIG. 5E in accordance with some embodiments. The processes for forming the doped region 224 may be similar to, or the same as, those for forming the doped region 124 described previously and therefore may not be repeated herein.

Figure 5F:
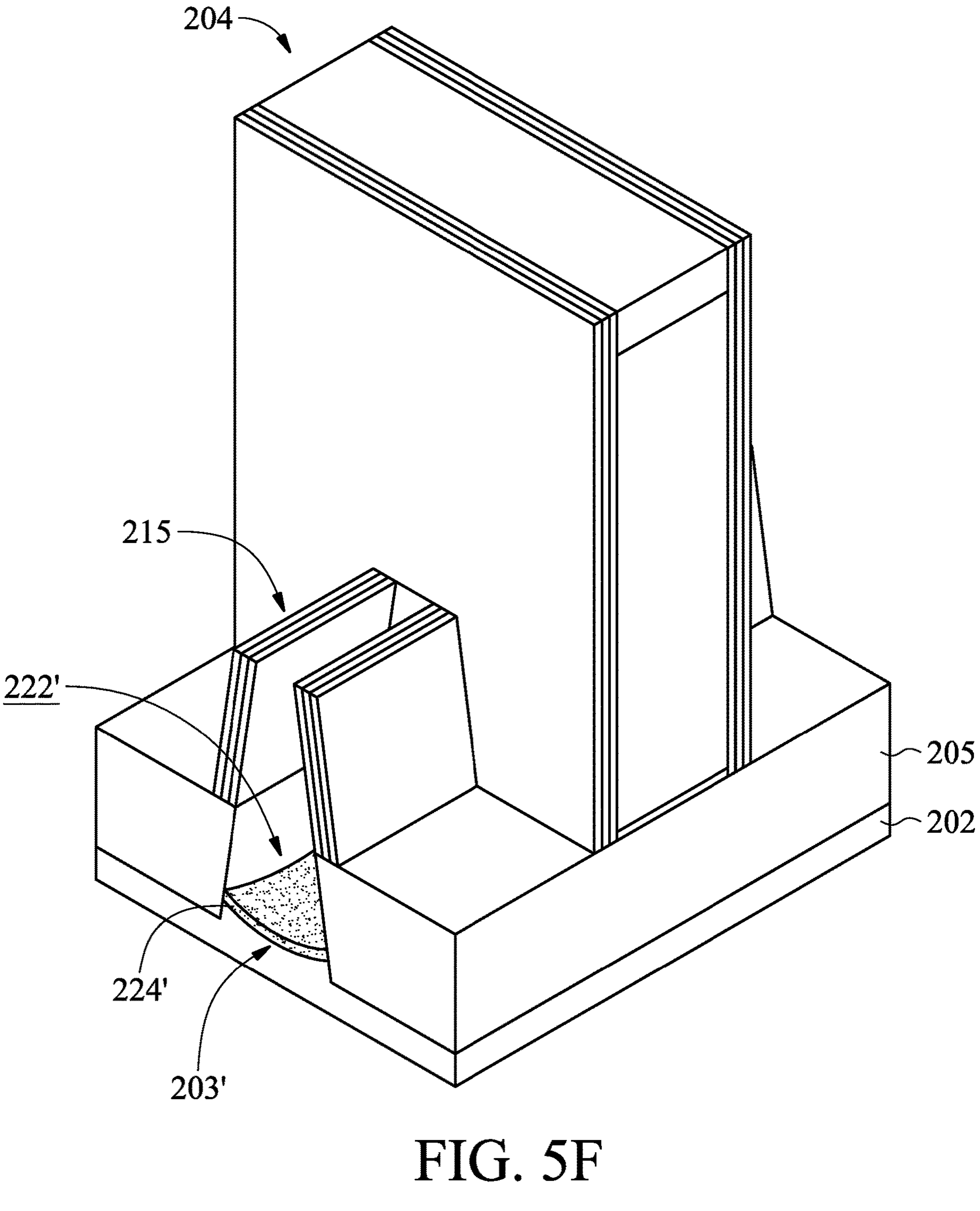

After the doped region 224 is formed, another etching process, similar to the etching process used to form the modified recess 122' shown in FIG. 1D, is performed to form a modified recess 222', as shown in FIG. 5F in accordance with some embodiments. In some embodiments, the modified recess 222' is surrounded by the remaining portion of doped region 224', similar to those shown in FIG. 1D. Afterwards, an annealing process is performed to the remaining portions of the doped regions 224'. As described previously, the annealing process may be an in-situ annealing process which is performed in the same chamber that is used to form source/drain structures in subsequent manufacturing processes.

Figure 5G:
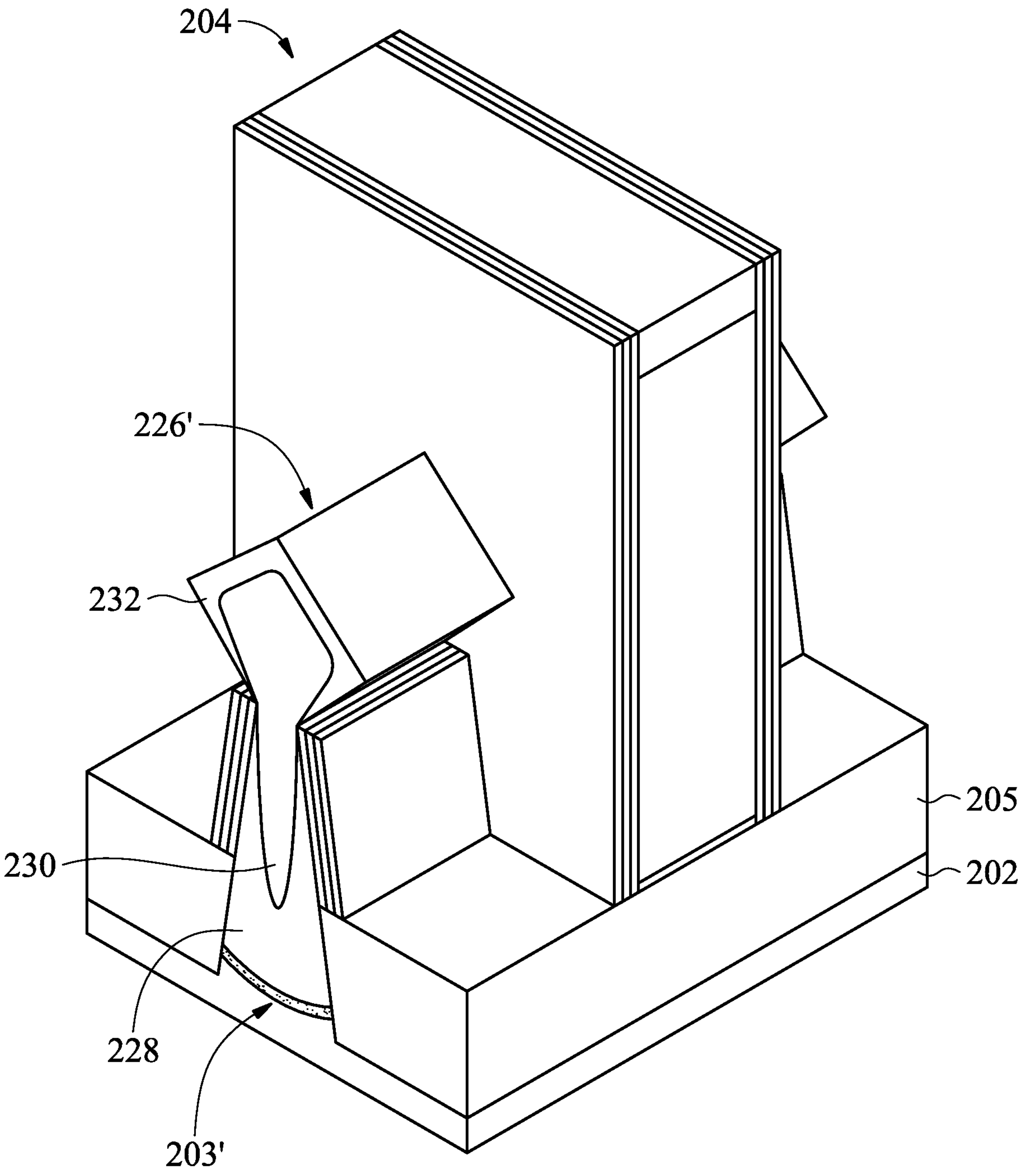

Next, a source/drain structure 226 is formed in the modified recess 222', as shown in FIG. 5G in accordance with some embodiments. The processes for forming the source/drain structure 226 may be similar to, or the same as, those for forming the source/drain structure 126 shown in FIG. 1E and may not be repeated herein. As shown in FIG. 5G, the source/drain structure 226 includes a first region 228, a second region 230, and a third region 232, which may be the same as the first region 128, the second region 130, and the third region 132.

Figure 5H:
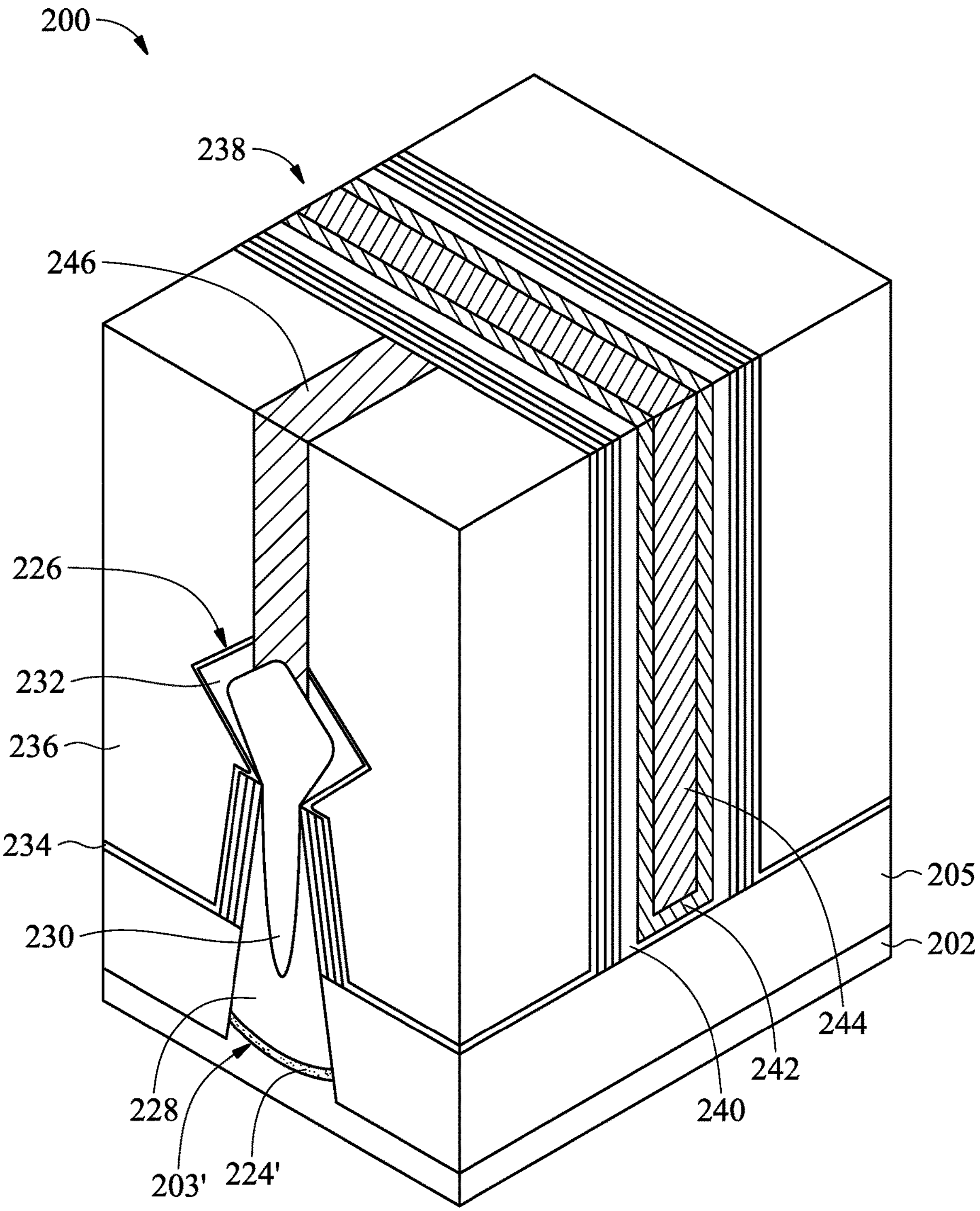

After the source/drain structure 226 is formed, a contact etch stop layer (CESL) 234 is conformally formed over substrate 102 to cover the source/drain structure 226, and an inter-layer dielectric (ILD) layer 236 is formed over contact etch stop layer 234, as shown in FIG. 5H in accordance with some embodiments.

In some embodiments, the contact etch stop layer 234 is made of silicon nitride, silicon oxynitride, and/or other applicable materials. The contact etch stop layer 234 may be formed by plasma enhanced CVD, low pressure CVD, ALD, or other applicable processes. The interlayer dielectric layer 236 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 236 may be formed by chemical vapor deposition (CVD), physical vapor deposition, (PVD), atomic layer deposition (ALD), spin-on coating, or other applicable processes.

After the contact etch stop layer 234 and the interlayer dielectric layer 236 are formed, a polishing process is performed until the top surface of the gate structure 204 is exposed. In some embodiments, a chemical mechanical polishing (CMP) process is performed.

Next, the gate structure 204 is replaced by a metal gate structure 238, as shown in FIG. 5H in accordance with some embodiments. In some embodiments, the metal gate structure 238 includes a gate dielectric layer 240, a work function metal layer 242, and a gate electrode layer 244. In some embodiments, the gate dielectric layer 240 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

The work function metal layer 242 is formed over the gate dielectric layer 240 in accordance with some embodiments. The work function metal layer 242 is customized to have the proper work function. In some embodiments, the gate electrode layer 244 is made of a conductive material, such as aluminum, copper, tungsten, titanium, tantulum, or other applicable materials.

After the metal gate structure 238 is formed, a contact 246 is formed on the source/drain structure 226 through the interlayer dielectric layer 236, as shown in FIG. 5H in accordance with some embodiments. In addition, the contact 246 further passes through the third region 232 of the source/drain structure 226 and is in direct contact with the second region 230 of the source/drain structure 226 in accordance with some embodiments. In some other embodiments, the contact 246 stops on the third region 232 of the source/drain structure 226 and does not pass through the third region 232 and therefore is not in direct contact with the second region 230 of the source/drain structure (not shown.)

In some embodiments, the contact 246 includes aluminum (Al), copper (Cu), tungsten (W), titanium (Ti), tantulum (Ta), titanium nitride (TiN), cobalt, nickel, tantalum nitride (TaN), nickel silicide (NiSi), cobalt silicide (CoSi), copper silicide, tantulum carbide (TaC), tantulum silicide nitride (TaSiN), tantalum carbide nitride (TaCN), titanium aluminide (TiAl), titanium aluminum nitride (TiAlN), other applicable conductive materials, or a combination thereof. In some embodiments, the contact 246 includes a titanium nitride layer and tungsten formed over the titanium nitride layer.

The contact 246 may further include a liner and/or a barrier layer. For example, a liner (not shown) may be formed on the sidewalls and bottom of the contact trench. The liner may be made of silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

Figure 6:
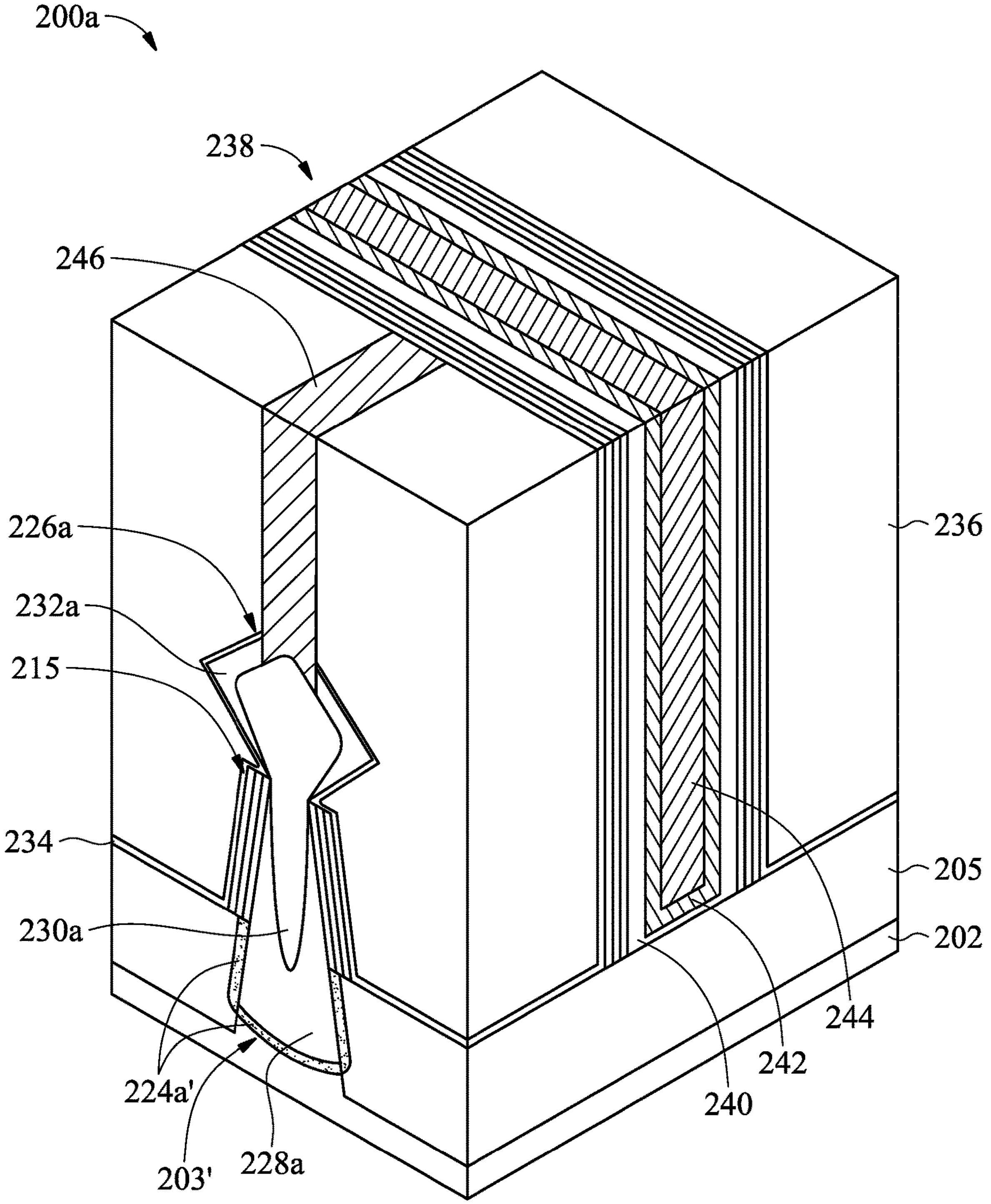
FIG. 6 illustrates a perspective view of a semiconductor structure 200*a* in accordance with some embodiments.

FIG. 6 illustrates a perspective view of a semiconductor structure 200*a* in accordance with some embodiments. The semiconductor structure 200*a* may be similar to, or the same as, the semiconductor structure 200 described above, except remaining portion of doped region 224*a*' extends under the spacers 215. Some processes and materials used to form the semiconductor structure 200*a* may be similar to, or the same as, those used to form the semiconductor structure 200 and are not repeated herein.

As shown in FIG. 6, unlike the remaining portion of the doped regions 224' shown in FIG. 5H, the remaining portion of the doped region 224*a*' in the semiconductor structure 200*a* further extends under the spacers 215. That is, the remaining portion of the doped region 224*a*' further extends into the isolation structure 205. In some embodiments, the remaining portion of the doped region 224*a*' also extends into the fin structure under the spacers 214 (not shown). As described previously, the remaining portion of the doped region 224*a*' may be used as a shielding layer to prevent the dopants in the source/drain structure 226*a* from entering the channel region under the metal gate structure 238*a*.

Although the contact etch stop layer 234 are shown in the semiconductor structures 200 and 200*a* shown in FIGS. 5H and 6, they may be optional in accordance with some embodiments.

Figure 7A:
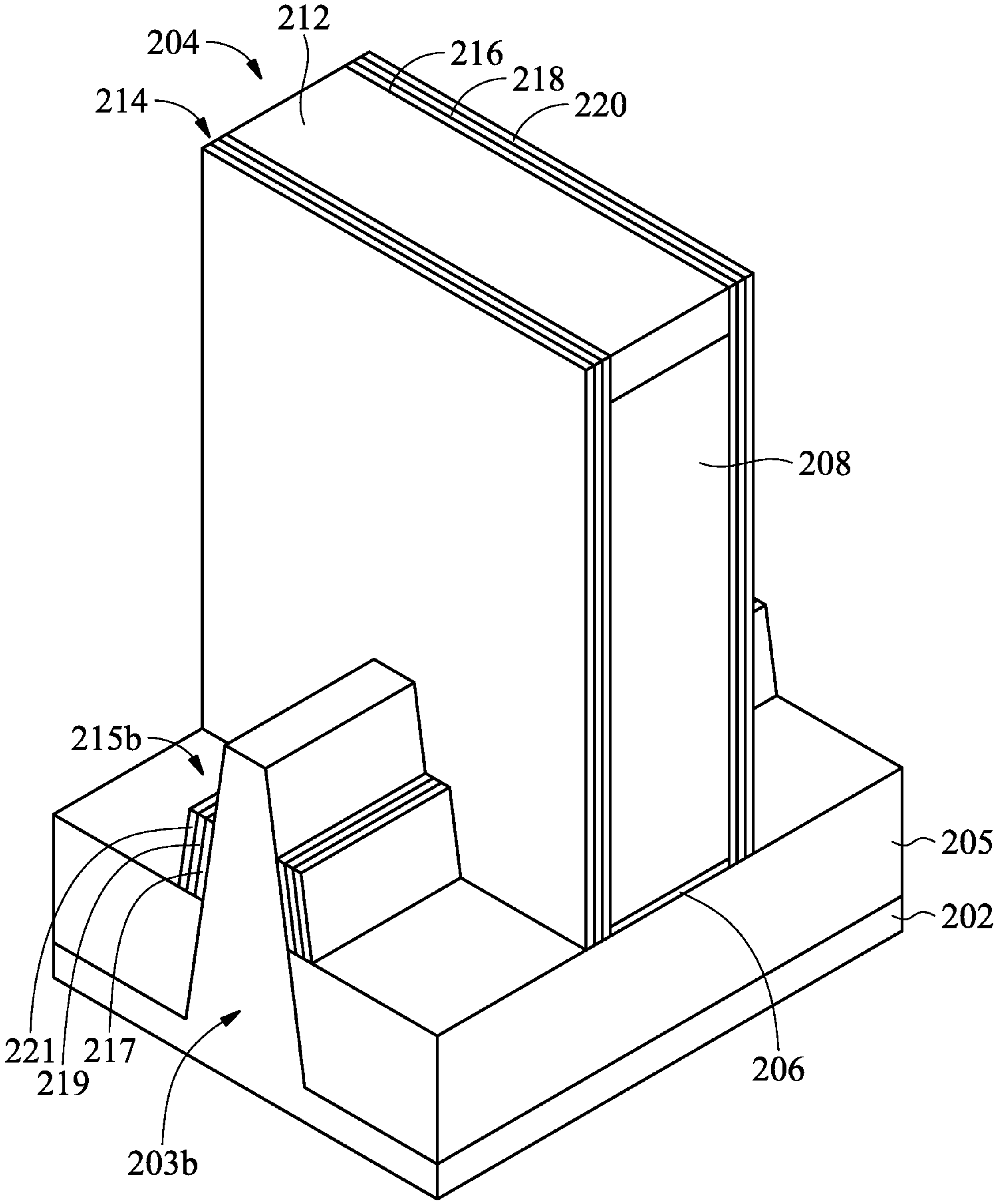
FIGS. 7A to 7C illustrate perspective views of various stages of manufacturing a semiconductor structure in accordance with some embodiments.
Figure 7B:
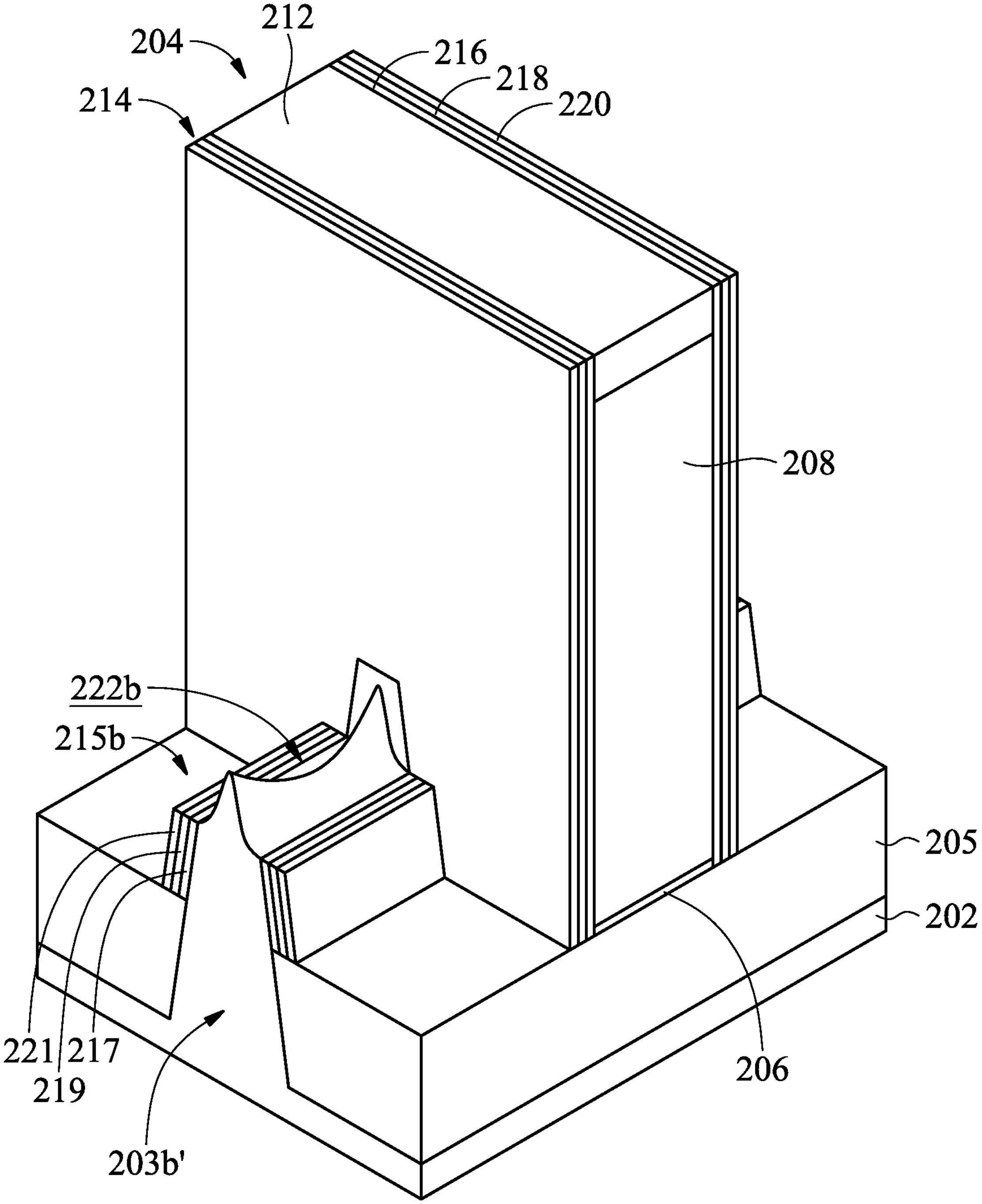
Figure 7C:
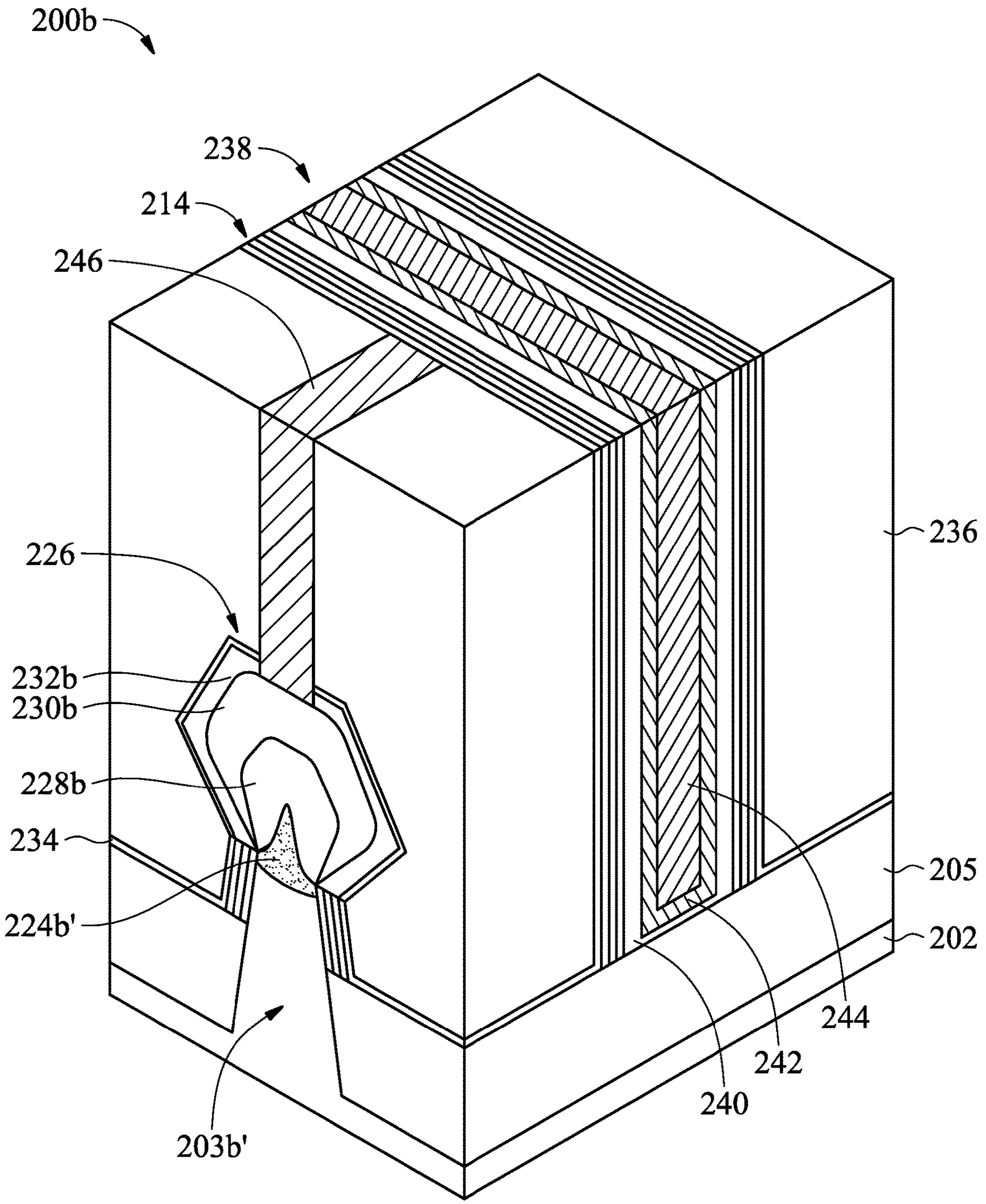

FIGS. 7A to 7C illustrate perspective views of various stages of manufacturing a semiconductor structure 200*b* in accordance with some embodiments. The semiconductor structure 200*c* may be similar to the semiconductor structures 200 and 200*a* described previously, except the fin structure in the semiconductor structure 200*b* is only partially recessed and therefore has a greater height. Some processes and materials used to form the semiconductor structure 200*b* may be similar to, or the same as, those used to form the semiconductor structures 200 and 200*a* described previously and are not repeated herein.

Processes shown in FIGS. 5A to 5C may be performed and are not repeated herein. More specifically, a fin structure 203*b* is formed over the substrate 202, and the isolation structure 205 is formed around the fin structure 203*b* in accordance with some embodiments. Next, the gate structure 204 including the gate dielectric layer 206, the gate electrode layer 208, and the hard mask layer 212, is formed across the fin structure 203*b* and the spacers 214, including the first dielectric layer 216, the second dielectric layer 218, and the third dielectric layer 220, are formed on the sidewalls of the gate structure 204 in accordance with some embodiments.

Afterwards, spacers 215*b* are formed on the bottom portions of the sidewalls of the fin structure 203*b*, as shown in FIG. 7A in accordance with some embodiments. The spacers 215*b* may be formed by forming spacers similar to the spacers 215 shown in FIG. 5C and then recessing the top portions of the spacers. In some embodiments, the spacers 215*b* also include the first dielectric layer 217, the second dielectric layer 219, and the third dielectric layer 221.

Next, the fin structure 203*b* is recessed to form the recessed fin structure 203*b*', and a recess 222*b*, similar to the recess 122 described above, is formed, as shown in FIG. 7B in accordance with some embodiments. In some embodiments, the bottommost portion of the recess 222*b* is higher than the top surface of the spacer 215*b*. Processes for recessing the fin structure 203*b* may by similar to, or the same as, those for recessing the fin structure 203 described previously and are not repeated herein.

After the recessed fin structure 203*b*' is formed, processes shown in FIGS. 5D to 5H may be performed to form the semiconductor structure 200*b*, as shown in FIG. 7C in accordance with some embodiments. More specifically, a doped region is formed around the recess 222*b* and the doped region is etched to form a modified recess with a remaining portion of the doped region 224*b*' in accordance with some embodiments. Afterwards, an annealing process is performed to the remaining portions of the doped regions 224*b*', and a source/drain structure 226*b* is formed in the modified recess, as shown in FIG. 7C in accordance with some embodiments.

As shown in FIG. 7C, the source/drain structure 226 includes a first region 228*b*, a second region 230*b*, and a third region 232*b*, which may be the similar to the first region 228, the second region 230, and the third region 232 described previously, except the source/drain structure 226 is formed around the recessed fin structure 203*b*'.

After the source/drain structure 226*b* is formed, the contact etch stop layer (CESL) 234 and the inter-layer dielectric (ILD) layer 236 are formed, and the gate structure 204 is replaced by the metal gate structure 238, as shown in FIG. 7C in accordance with some embodiments. Similarly, the metal gate structure 238 includes the gate dielectric layer 240, the work function metal layer 242, and the gate electrode layer 244. After the metal gate structure 238 is formed, the contact 246 is formed on the source/drain structure 236*b* through the interlayer dielectric layer 236 in accordance with some embodiments. In addition, the contact 246 further passes through the third region 232*b* of the source/drain structure 236*b* and is in direct contact with the second region 230*b* of the source/drain structure 236*b* in accordance with some embodiments. FIGS. 8A to 8D illustrate cross-sectional representations of various stages of manufacturing a semiconductor structure 300 in accordance with some embodiments. The semiconductor structure 300 may be similar to the semiconductor structure 100, except the doped region is deposited onto the recess instead of being doping into the substrate from the recess.

Figure 8A:
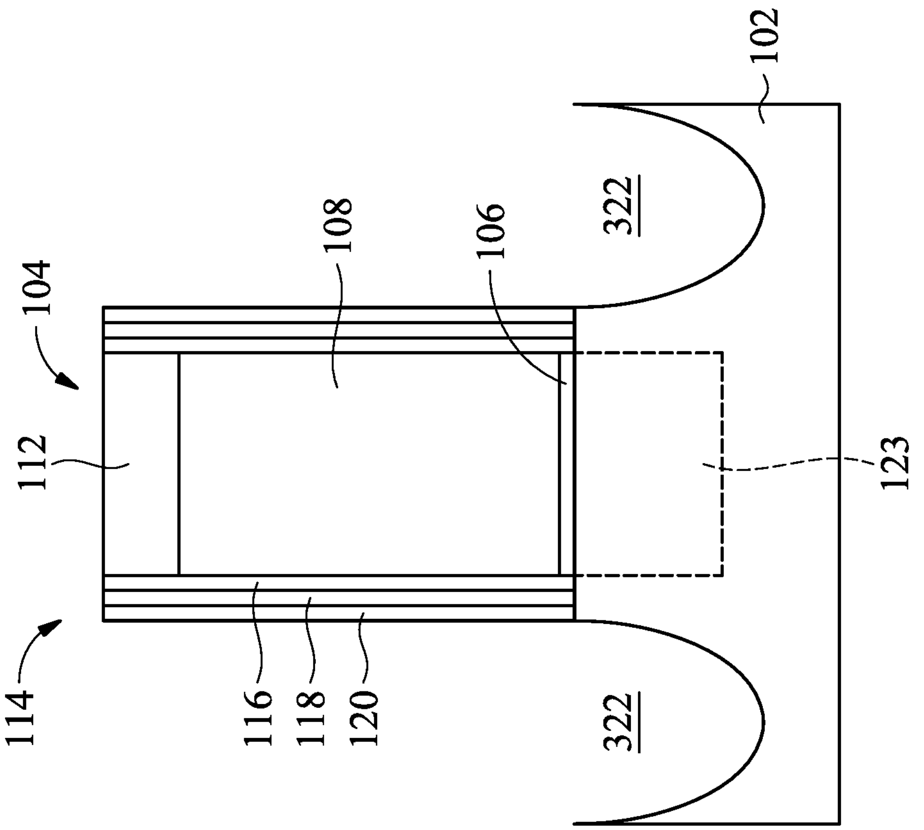
FIGS. 8A to 8D illustrate cross-sectional representations of various stages of manufacturing a semiconductor structure in accordance with some embodiments.
Figure 8B:
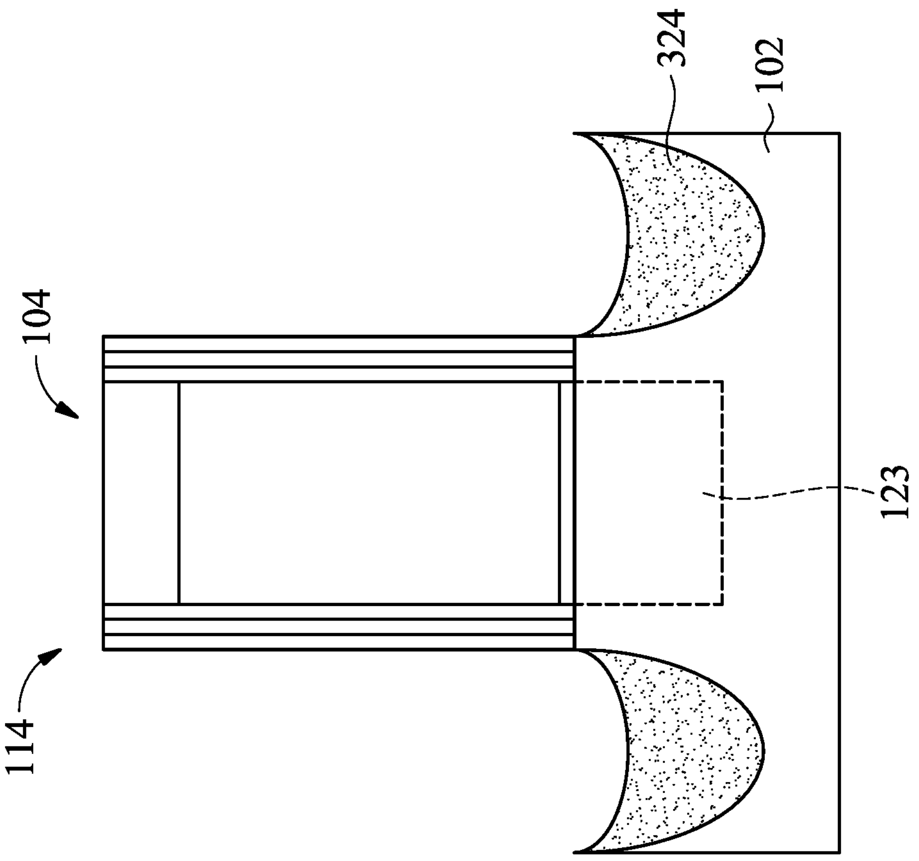

More specifically, recesses 322 are formed in the substrate 102 adjacent to the spacers 114 formed on the sidewalls of the gate structure 104, as shown in FIG. 8A in accordance with some embodiments. The recesses 322 are formed by etching the substrate 102 using a fluorine-based etchant in accordance with some embodiments. After the recesses 322 are formed, doped layers 324 are formed covering the recesses 322, as shown in FIG. 8B in accordance with some embodiments. In some embodiments, the doped layers 324 are SiAs layers. In some embodiments, the doped layer 324 has a thickness in a range from about 30 nn to about 130 nn. The doped layer 324 should be thick enough so the modified recess formed afterward can have a greater bottom width. The doped layers 324 may be formed by chemical vapor deposition (CVD), physical vapor deposition, (PVD), atomic layer deposition (ALD), spin-on coating, or other applicable processes.

Figure 8C:
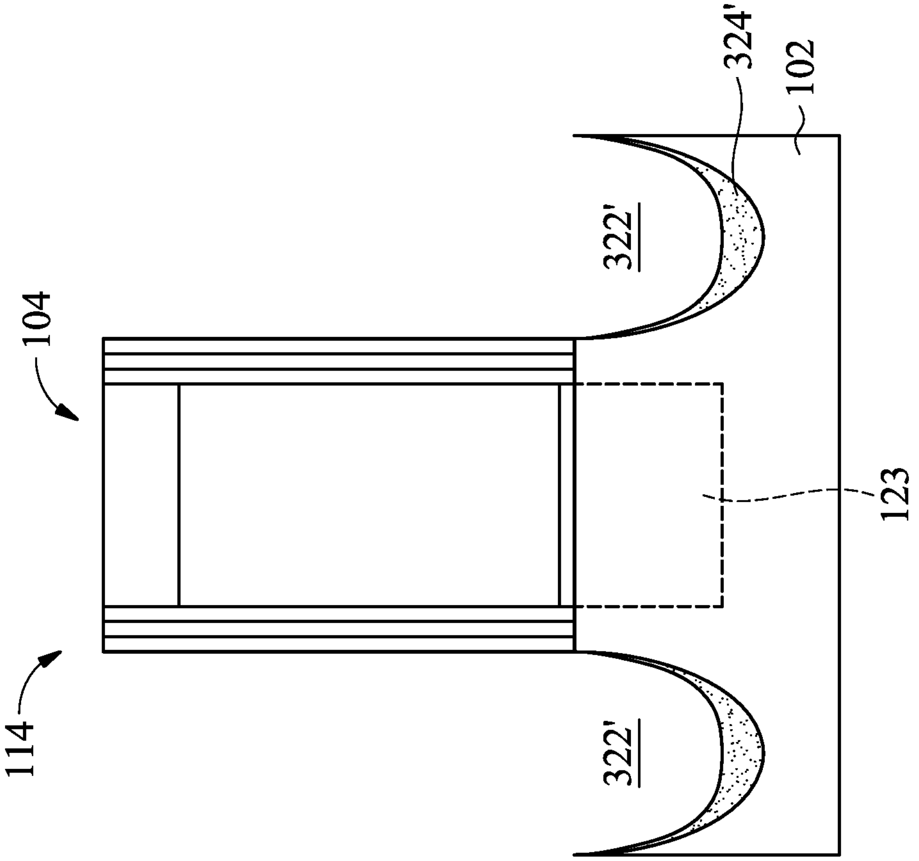
Figure 8D:
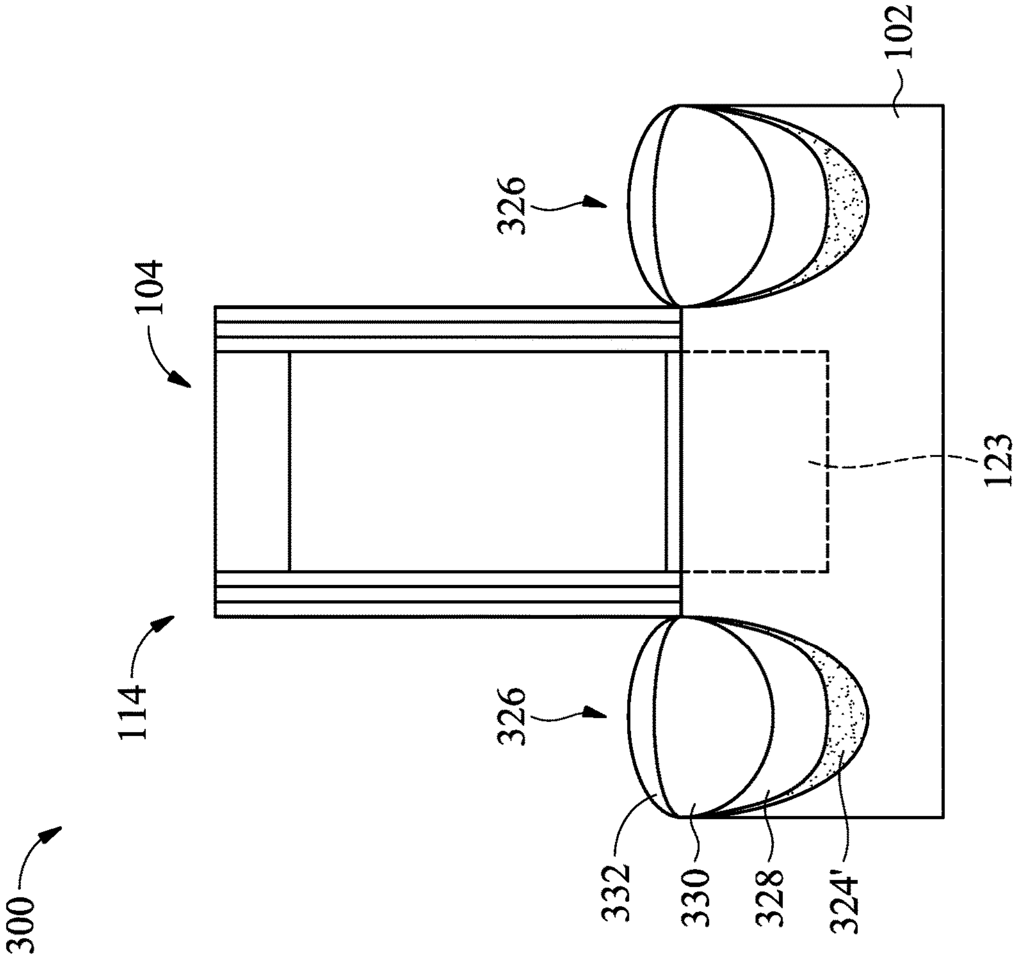

Next, the doped layers 324 are partially removed to form modified recesses 322' with remaining portions of the doped layers 324, as shown in FIG. 8C in accordance with some embodiments. Afterwards, source/drain structures 326 are formed in the modified recesses 322', as shown in FIG. 8D in accordance with some embodiments.

In particular, the removal of the doped layer 324 is easier to control, similar to the doped regions 124 described previously. Therefore, the shapes of the modified recesses 322' formed by partially removing the doped layers 324 may be easier to control. Accordingly, the shapes of the source/drain structures 326 formed in the recesses 322 may be easier to control, and the performance of the semiconductor structure 300 including the source/drain structure 326 may be improved. In addition, the remaining portion of the doped layers 324 surround the source/drain structures 326, and therefore dopant diffusion from the source/drain structures 326 into the channel region under the gate structure 304 may be prevented.

As described previously, the source/drain structures 126, 126*a*, 126*b*, 126*c*, 226, 226*a*, 226*b* and 326 are formed in the modified recesses, which are formed by etching the doped regions/doped layer, and therefore the shape of the source/drain structures 126, 126*a*, 126*b*, 126*c*, 226, 226*a*, 226*b* and 326 may be easier to control. For example, the source/drain structures may have the relatively greater bottom widths, and therefore the current efficiency of the source/drain structures may be improved. Accordingly, the threshold voltage and the subthreshold slope may be reduced. In particular, for FINFET structures such as the semiconductor structures 200, 200*a* and 200*b*, forming recesses having wide bottom widths are even more difficult than those formed in planer structures, especially when the fins have slope sidewalls. Therefore, by forming the doped regions and partially removing the doped regions to form the modified recesses, the shape of the source/drain structures may be easier to controlled, and the performance of the semiconductor structures may be improved.

Furthermore, the shape of the top portion of the source/drain structures 126, 126*a*, 126*b*, 126*c*, 226, 226*a*, 226*b*, and 326 may be formed as designed, and therefore issues such as short channel effect and DIBL (drain induced barrier lowering) may be reduced.

In addition, the original recesses formed by fluorine-based etching may have fluorine residues left on the recesses, and the residues may be removed by the etching processes used to form the modified recesses in accordance with some embodiments. In some embodiments, the remaining portion of the doped region under the source/drain structure is used as a shielding layer, so that contaminate under the source/drain structure will not entered into the source/drain structure in subsequent manufacturing processes. In addition, the remaining portion of the doped region around the sidewalls of the source/drain structure is used as a shielding layer to prevent the dopant in the source/drain structure from entering the channel region in subsequent manufacturing processes.

Embodiments for forming semiconductor structures are provided. The semiconductor structure may include a source/drain structure formed in a modified recess adjacent to a gate structure. The modified recess may be formed by forming an original recess first and forming a doped layer/doped region at the recess. Afterwards, the doped layer/doped region may be partially removed to form the modified recess. The shape of the modified recess may be easier to control since it is formed by etching the doped layer/doped region, the source/drain structure formed in the modified recess also has a modified shape as designed, and therefore the performance of the semiconductor structure including the source/drain structure may be improved.

In some embodiments, a method for forming a semiconductor structure is provided. The method includes forming a fin structure extending in a first direction over a substrate and forming spacers on sidewalls of the fin structure to laterally sandwiched the fin structure in a second direction. The method further includes etching the fin structure in a third direction to form a recess between the spacers and forming a doped region in the fin structure exposed by the recess. The method further includes removing an upper portion of the doped region and annealing a bottom portion of the doped region after removing the upper portion of the doped region. The method further includes forming a source/drain structure over the bottom portion of the doped region.

In some embodiments, a method for forming a semiconductor structure is provided. The method includes forming a fin structure over a substrate longitudinally oriented along a first direction and forming a gate structure around a channel region of the fin structure and longitudinally oriented along a second direction. The method further includes forming a first spacer layer in contact with a sidewall of the fin structure in the second direction and recessing the fin structure to form a recess. The method further includes forming a first doped region having a first thickness in a third direction in the fin structure under the recess and thinning the first doped region to a second thickness in the third direction. The method further includes forming a source/drain structure in the recess.

In some embodiments, a method for forming a semiconductor structure is provided. The method includes forming a fin structure over a substrate and forming an isolation structure around the fin structure. The method further includes forming a gate structure across the fin structure and forming spacers on sidewalls of the fin structure. The method further includes recessing the fin structure not covered by the gate structure to form a curved top surface and implanting As from the curved top surface to form a doped region. The method further includes etching an upper portion of the doped region and forming a source/drain structure over a bottom portion of the doped region after etching the upper portion of the doped region. In addition, a bottom surface of the bottom portion of the doped region is lower than bottom surfaces of the spacers.

In some embodiments, a method for forming a semiconductor structure is provided. The method includes forming a gate structure over a substrate and forming a recess in the substrate adjacent to the gate structure. The method further includes forming a doped region at a sidewall and a bottom surface of the recess and partially removing the doped region to modify a shape of the recess. The method further includes forming a source/drain structure over a remaining portion of the doped region.

In some embodiments, a method for forming a semiconductor structure is provided. The method includes forming a fin structure having a slope sidewall over a substrate and forming a gate structure over the fin structure. The method further includes etching the fin structure to form a recess and implanting As from the recess to form a doped region. The method further includes etching the doped region to partially remove the doped region and forming a source/drain structure over a remaining portion of the doped region.

In some embodiments, a semiconductor structure is provided. The semiconductor structure includes a fin structure having slope sidewalls formed over a substrate and a gate structure formed across the fin structure. The semiconductor structure further includes a source/drain structure formed in the fin structure. In addition, the source/drain structure includes a first P-doped region, a second P-doped region formed over the first region, and a third P-doped region formed over the second region. Furthermore, concentrations of P in the first region, the second region, and the third region gradually increase. The semiconductor structure further includes an As-doped region formed under the source/drain structure and in direct contact with the first region.

In some embodiments, a semiconductor structure is provided. The semiconductor structure includes a fin structure protruding from a substrate and a gate structure formed across the fin structure. The semiconductor structure further includes an Arsenic-doped region formed in the fin structure and a source/drain structure formed over the Arsenic-doped region. In addition, a bottommost portion of the Arsenic-doped region is lower than a bottommost portion of the source/drain structure.

In some embodiments, a semiconductor structure is provided. The semiconductor structure includes a fin structure protruding from a substrate and an isolation structure formed around the fin structure. The semiconductor structure further includes a gate structure formed across the fin structure and extending over the isolation structure and a source/drain structure formed over the fin structure. The semiconductor structure further includes an Arsenic-doped region sandwiched between the fin structure and a bottommost portion of the source/drain structure.

In some embodiments, a semiconductor structure is provided. The semiconductor structure includes a gate structure formed over a channel region of a substrate and an Arsenic-doped region formed in the substrate adjacent to the channel region. The semiconductor structure further includes a source/drain structure formed over the Arsenic-doped region. In addition, a bottommost portion of the source/drain structure is in direct contact with the Arsenic-doped region.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a fin structure extending in a first direction over a substrate;

forming spacers on sidewalls of the fin structure to laterally sandwiched the fin structure in a second direction;

etching the fin structure in a third direction to form a recess between the spacers;

forming a doped region in the fin structure exposed by the recess;

removing an upper portion of the doped region;

annealing a bottom portion of the doped region after removing the upper portion of the doped region; and forming a source/drain structure over the bottom portion of the doped region.

2. The method for forming a semiconductor structure as claimed in claim 1, further comprising:

forming an isolation structure around the fin structure, wherein the doped region is in connect with the isolation structure.

3. The method for forming a semiconductor structure as claimed in claim 2, wherein the doped region overlaps the spacers in the third direction.

4. The method for forming a semiconductor structure as claimed in claim 1, wherein the doped region is in contact with the spacers.

5. The method for forming a semiconductor structure as claimed in claim 1, wherein the source/drain structure comprises a first region, a second region over the first region, and a third region over the second region, and the first region, the second region, and the third region have different concentrations of phosphorus and sequentially stacked along the third direction.

6. The method for forming a semiconductor structure as claimed in claim 5, further comprising:

forming a contact over the source/drain structure, wherein a bottom surface of the contact is lower than a top surface of the third region of the source/drain structure.

7. A method for forming a semiconductor structure, comprising:

forming a fin structure over a substrate longitudinally oriented along a first direction;

forming a gate structure around a channel region of the fin structure and longitudinally oriented along a second direction;

forming a first spacer layer in contact with a sidewall of the fin structure in the second direction;

recessing the fin structure to form a recess;

forming a first doped region having a first thickness in a third direction in the fin structure under the recess;

thinning the first doped region to a second thickness in the third direction; and forming a source/drain structure in the recess.

8. The method for forming a semiconductor structure as claimed in claim 7, wherein the first doped region comprises As.

9. The method for forming a semiconductor structure as claimed in claim 7, further comprising:

forming a second spacer layer over the first spacer layer; and forming a third spacer layer over the second spacer layer, wherein the source/drain structure overlaps the first spacer layer, the second spacer layer, and the third spacer layer in the third direction.

10. The method for forming a semiconductor structure as claimed in claim 7, further comprising:

forming an isolation structure around the fin structure; and forming a second doped region in the isolation structure.

11. The method for forming a semiconductor structure as claimed in claim 10, wherein the first doped region and the second doped region both comprise As.

12. The method for forming a semiconductor structure as claimed in claim 10, wherein the second doped region is in contact with a bottom surface of the first spacer layer.

13. The method for forming a semiconductor structure as claimed in claim 10, wherein the first doped region is in contact with the second doped region in the second direction.

14. A method for forming a semiconductor structure, comprising:

forming a fin structure over a substrate;

forming an isolation structure around the fin structure;

forming a gate structure across the fin structure;

forming spacers on sidewalls of the fin structure;

recessing the fin structure not covered by the gate structure to form a curved top surface;

implanting As from the curved top surface to form a doped region;

etching an upper portion of the doped region; and forming a source/drain structure over a bottom portion of the doped region after etching the upper portion of the doped region, wherein a bottom surface of the bottom portion of the doped region is lower than bottom surfaces of the spacers.

15. The method for forming a semiconductor structure as claimed in claim 14, wherein the doped region is in contact with sidewalls of the spacers.

16. The method for forming a semiconductor structure as claimed in claim 14, further comprising:

annealing the doped region before the source/drain structure is formed.

17. The method for forming a semiconductor structure as claimed in claim 14, wherein a top surface of the doped region is higher than top surfaces of the spacers.

18. The method for forming a semiconductor structure as claimed in claim 17, wherein a bottom surface of the doped region is lower than the top surfaces of the spacers.

19. The method for forming a semiconductor structure as claimed in claim 14, wherein the source/drain structure comprises:

a first region;

a second region formed over the first region, wherein a concentration of phosphorus in the second region is greater than a concentration of phosphorus in the first region; and a third region formed over the second region, wherein a concentration of phosphorus in the second region is greater than a concentration of phosphorus in the third region.

20. The method for forming a semiconductor structure as claimed in claim 19, wherein the As in the doped region diffuses into the first region of the source/drain structure.

* * * * *